United States Patent [19]
Tahara

[11] Patent Number: 5,844,845
[45] Date of Patent: Dec. 1, 1998

[54] DATA READ CIRCUIT FOR USE IN SEMICONDUCTOR STORAGE APPARATUS OF CMOS MEMORY

[75] Inventor: Yoshiaki Tahara, Hyogo, Japan

[73] Assignee: Mitsubishi Denki Kabushiki Kaisha, Tokyo, Japan

[21] Appl. No.: 899,773

[22] Filed: Jul. 24, 1997

[30] Foreign Application Priority Data

Jan. 29, 1997 [JP] Japan .................................... 9-015131

[51] Int. Cl.$^6$ ............................... G11C 7/00; G11C 8/00
[52] U.S. Cl. ............................... 365/189.05; 365/230.03; 365/230.06; 365/230.08; 365/207
[58] Field of Search ........................ 365/189.05, 189.11, 365/207, 230.03, 230.06, 230.08

[56] References Cited

U.S. PATENT DOCUMENTS

| | | | |
|---|---|---|---|
| 5,177,573 | 1/1993 | Ukita et al. | 365/189.05 |
| 5,319,595 | 6/1994 | Saruwatari | 365/230.03 |
| 5,481,497 | 1/1996 | Yamauchi et al. | 365/189.05 |

FOREIGN PATENT DOCUMENTS 2-021495A  1/1990  Japan .
6-111576A  4/1994  Japan .

*Primary Examiner*—David Nelms
*Assistant Examiner*—Trong Phan

[57] ABSTRACT

There is disclosed a data read circuit for use in a semiconductor storage apparatus of a CMOS memory, in which a memory cell array of the semiconductor storage apparatus is divided into a plurality of memory blocks. Each of the memory blocks comprises a sense amplifier for amplifying a data output signal from a memory cell, and a read signal from the sense amplifier of the memory block selected by a block select signal obtained by decoding an external address is transmitted via a read data bus to a data output circuit having a data latch circuit. The data read circuit includes an NMOS or PMOS transistor for being turned on and off in response to a read signal from the sense amplifier in a data reading stage when the sense amplifier is activated. The NMOS transistor is disposed on each of the memory blocks, and has a drain connected to the read data bus and a grounded source. A first or second level signal is respectively outputted to the read data bus by turning on the NMOS or PMOS transistor when the read signal from the sense amplifier has a first level. On the other hand, the read signal from the sense amplifier is stopped from being outputted to the read data bus by turning off the NMOS transistor when the read signal from the sense amplifier has a second level.

28 Claims, 25 Drawing Sheets

First Preferred Embodiment

Second Preferred Embodiment — Read Signal Generator Circuit B1b

Second Preferred Embodiment — Data output Control Circuit B9a

Fig.29 Modified Preferred Embodiment of First Preferred Embodiment

Modified Preferred Embodiment of Second Preferred Embodiment

DATA READ CIRCUIT FOR USE IN SEMICONDUCTOR STORAGE APPARATUS OF CMOS MEMORY

BACKGROUND OF THE INVENTION

1. Field of the Invention

The present invention relates to a data read circuit for use in a semiconductor storage apparatus of a CMOS (Complementary Metal-Oxide-Semiconductor) memory, and a semiconductor storage apparatus of a CMOS memory provided with a data read circuit, and in particular, to a data read circuit for use in a semiconductor storage apparatus of a CMOS memory and a semiconductor storage apparatus of a CMOS memory provided with a data read circuit in which the drain capacity of a drive circuit for driving a read data bus in a semiconductor storage apparatus of a CMOS memory such as an SRAM (Static Random Access Memory) or the like is reduced for an attempt at increasing the speed of read access and reducing the consumption current.

2. Description of the Prior Art

FIG. 25 is a block diagram of a prior art SRAM data read circuit, FIG. 26 is a block diagram of a data output circuit B4 shown in FIG. 25, FIG. 27 is a block diagram of a read signal generator circuit BE shown in FIG. 25, and FIG. 28 is a timing chart showing an operation of the prior art SRAM data read circuit shown in FIG. 25.

In FIG. 25, each of the reference numerals B1(1) to B1(n) denotes the read signal generator circuit B1 having the construction shown in FIG. 27. When an SRAM memory cell array is divided into a plurality of n memory blocks, the read signal generator circuit B1 is a circuit which is provided with a sense amplifier 1 for amplifying an output signal from a memory cell every block, and outputs to a read data bus RDB a data read signal outputted from a sense amplifier 1 in one memory block selected by block select signals BS1 to BSn (one block select signal is referred to as a BS signal hereinafter) obtained by decoding an external address signal inside the SRAM device. The reference numeral B5 denotes a circuit for outputting an enable signal for activating the sense amplifier 1 in a data reading stage to the read signal generator circuits B1(1) to B1(n) and is comprised of NAND gates 21 and 22. The reference numeral B4 denotes a data output circuit having a data latching function, and the data output circuit B4 temporarily stores therein read data inputted from the read signal generator circuit B1 of each memory block via the read data bus RDB and then outputs the data based on an output enable signal OE (referred to as an OE signal hereinafter), a write enable signal (referred to as a WE signal hereinafter) and a write data signal WD (referred to as a WD signal hereinafter).

In FIG. 26, when an input signal G that is the OE signal comes to have a high level (referred to as an H level hereinafter) having, for example, a voltage of 5 V, the input signal G is inputted to a node n7 via an inverter 11, and the node n7 comes to have a low level (referred to as an L level hereinafter), which is, for example, the grounding potential. A NAND gate 12 and a NOR gate 13 invert an H-level signal or an L-level signal at the node n6, and the obtained inverted signal is applied via nodes n8 and n9 to the gates of a PMOS transistor 14 and an NMOS transistor 15. Consequently, either one of the PMOS transistor 14 and the NMOS transistor 15 is turned on so as to output a read signal latched in a data latch circuit B2 to an external output terminal Dout. When the input signal G comes to have the L level, the node n7 comes to have the H level, and the input signal G is applied via the NAND gate 12 and the NOR gate 13 to the gates of the PMOS transistor 14 and the NMOS transistor 15. In this stage, the node n8 comes to have the H level, while a node n9 comes to have the L level. Consequently, both of the PMOS transistor 14 and the NMOS transistor 15 are turned off, so that the output state of an output signal H comes to have a high impedance. The reference numeral B2 denotes a data latch circuit comprised of inverters 9 and 10 which are connected in series with each other in a loop form and in which the input terminal of the inverter 9 and the output terminal of the inverter 10 are both connected to the node n6, and the data latch circuit B2 operates to latch the read signal outputted via the read data bus RDB. The reference numeral B3 denotes a data latch control circuit provided with a clocked inverter comprised of an inverter 16, PMOS transistors 17 and 18 and NMOS transistors 19 and 20. An input signal K that is the WE signal comes to have the H level in the stage of a write operation of the SRAM, when the above-mentioned clocked inverter is activated. By this operation, the clocked inverter inverts an input signal J that is the WD signal, outputs the inverted signal to the data latch circuit B2 and stores writing data of the WD signal. Further, in the data latch control circuit B3, the input signal K that is the WE signal comes to have the L level in the stage of a read operation. By this operation, the clocked inverter is deactivated, so that the output state of the node n6 that is the output node of the data latch circuit B2 comes to have a high impedance.

The read signal generator circuit B1 shown in FIG. 27 is characterized in being provided with a CMOS inverter comprised of a PMOS transistor 7 and an NMOS transistor 8 in an output circuit of a read signal E. In FIG. 27, when both of an input signal C that is a BS signal and an enable signal D from an enable signal generator circuit B5 come to have the L level, an output signal of a NOR gate 4 comes to have the H level. By this operation, an NMOS transistor 5 is turned on, and the sense amplifier 1 is activated. When the sense amplifier 1 is activated, input signals A and B that are data read signals from the I/O line of the memory cell of the SRAM are subjected to differential amplification, and thereafter the amplified signal is outputted to a node n1. The signal turns on either the PMOS transistor 7 or the NMOS transistor 8 via a NAND gate 2 or a NOR gate 3 to drive the read data bus RDB. Further, when either one of the input signals C and D comes to have the H level, a node n2 comes to have the L level, when the sense amplifier 1 is deactivated. By this operation, the signal at the node n2 is inputted via an inverter 6 to a node n3, so that the node n2 comes to have the H level. The signal at the node n2 is applied via the NAND gate 2 and the NOR gate 3 to the gates of the PMOS transistor 7 and the NMOS transistor 8. In this stage, a node n4 comes to have the H level, a node n5 comes to have the L level, both of the PMOS transistor 7 and the NMOS transistor 8 are turned off, and the output state of the output signal E comes to have a high impedance.

The timing chart of FIG. 28 shows an operation of reading data in two cycles with external addresses of an address A(0) and an address A(1) for the reading of data from the address A(0) and the address A(1), and it is assumed that data different from each other have been preparatorily written in the address A(0) and the address A(1) (e.g., when the data stored in the address A(0) is "0", the data stored in the address A(1) is "1"). It is further assumed that the data stored in the address A(0) and the data stored in the address A(1) are each outputted from the read signal generator circuit B1(1) shown in FIG. 25. It is further assumed that the input signal G is fixed to the H level and the input signal K is fixed to the L level in FIG. 26.

A read operation of the prior art SRAM will be described below with reference to FIG. 28.

When an external CS signal comes to have the L level upon reading the data stored in the address A(0), the BS1 signal comes to have the L level. Consequently, the memory block of the read signal generator circuit B1(1) is selected to be activated, an SE signal for selecting between writing and reading comes to have the H level, and the data stored in the memory block of the read signal generator circuit B1(1) is permitted to be read. Further, in response to a trailing edge of the external CS signal, a CSTD (Chip Selection Transition Detection) pulse signal that is a negative pulse signal is generated. By this operation, a positive pulse signal is generated at a node n11 via a NAND gate 22 as shown in FIG. 25, a negative pulse signal is generated at a node n12 via a NAND gate 21, and a positive pulse signal is generated at the node n2 via the NOR gate 4. The sense amplifier 1 is activated for an interval t1 when the positive pulse signal is generated at the node n2, an H-level signal which serves as the data stored in the address A(0) is outputted to the node n1, and the signal at the node n1 is applied via the NAND gate 2 or the NOR gate 3 shown in FIG. 27 to the gates of the PMOS transistor 7 and the NMOS transistor 8. In this stage, the nodes n4 and n5 come to have the L level, by which the PMOS transistor 7 is turned on and the NMOS transistor 8 is turned off. On the other hand, an H-level signal is outputted to the read data bus RDB, the signal is stored into the data latch circuit B2, and thereafter an H-level signal is outputted to the external output terminal Dout.

In this stage, the level of the read data bus RDB before the sense amplifier 1 is activated is made to have either one of the H level and the L level by the data latch circuit B2 shown in FIG. 26. In the case of the L level, due to the drain capacities of the PMOS transistor 7 and the NMOS transistor 8 of the read signal generator circuits B1(1) to B1(n) and the wiring capacity of the read data bus RDB itself, a leading time tr of the signal on the read data bus RDB (according to a strict definition, the time is the leading time required for the signal to rise from its 10% level to its 90% level) becomes longer, as a consequence of which a delay time t3 ranging from the timing when the sense amplifier 1 is activated to the timing when a read signal is outputted to the external output terminal Dout is generated.

Upon reading the data stored in the address A(1), an ATD (Address Transition Detection) signal that is a negative pulse signal is generated in response to the change of the external address signal, and the ATD signal is applied to the node n11 via the NAND gate 22 shown in FIG. 25. Consequently, a positive pulse signal is generated at the node n11, the positive pulse signal is applied via the NAND gate 21 to the node n12. On the other hand, a negative pulse signal is generated at the node n12, the negative pulse signal is applied to the node n2 via the NOR gate 4 shown in FIG. 27, and a positive pulse signal is generated at the node n2. The sense amplifier 1 is activated for an interval t2 when the positive pulse signal is generated at the node n2, and subsequently an L-level signal is outputted to the external output terminal Dout with a delay time t4 in a manner similar to the operation of reading the data stored in the address A(0). In the timing chart shown in FIG. 28, hatched portions of the signal at the node n1 indicate that the sense amplifier 1 is deactivated and the signal level is undefined.

Accordingly, with the increase of the stray capacitance of the read data bus RDB as a consequence of the increase in number of the memory blocks of the memory cell array in accordance with the increase in capacity of the semiconductor storage apparatus, the delay times t3 and t4 are extended to prolong the required time, and this may cause an erroneous read so that the data in the preceding cycle is erroneously read from another address in the next cycle. Furthermore, charge and discharge currents of the read data bus RDB increase, consequently hindering the attempt at increasing the operating speed and reducing the consumption power.

SUMMARY OF THE INVENTION

An essential object of the present invention is to provide a data read circuit for use in a semiconductor storage apparatus of a CMOS memory, capable of operating at higher speed than that of the prior art without any erroneous read and capable of reducing the consumption power.

Another object of the present invention is to provide a semiconductor storage apparatus of a CMOS memory, capable of operating at higher speed than that of the prior art without any erroneous read and capable of reducing the consumption power.

A further object of the present invention is to provide a data read circuit for use in a semiconductor storage apparatus of a CMOS memory, capable of reducing the layout area of the semiconductor storage apparatus by providing a read data bus and a write data bus for common use.

A still further object of the present invention is to provide a semiconductor storage apparatus of a CMOS memory, capable of reducing the layout area of the semiconductor storage apparatus by providing a read data bus and a write data bus for common use.

In order to achieve the above-mentioned objective, according to one aspect of the present invention, there is provided a data read circuit for use in a semiconductor storage apparatus of a CMOS memory, wherein a memory cell array of said semiconductor storage apparatus is divided into a plurality of memory blocks, wherein each of said memory blocks comprises a sense amplifier for amplifying a data output signal from a memory cell, wherein a read signal from said sense amplifier of said memory block selected by a block select signal obtained by decoding an external address is transmitted via a read data bus to a data output circuit having a data latch circuit, said data read circuit comprising:

an NMOS transistor for being turned on and off in response to a read signal from said sense amplifier in a data reading stage when said sense amplifier is activated, said NMOS transistor disposed on each of said memory blocks, said NMOS transistor having a drain connected to said read data bus and a grounded source, wherein a first level signal is outputted to said read data bus by turning on said NMOS transistor when the read signal from said sense amplifier has a first level, while the read signal from said sense amplifier is stopped from being outputted to said read data bus by turning off said NMOS transistor when the read signal from said sense amplifier has a second level.

According to another aspect of the present invention, there is provided a data read circuit for use in a semiconductor storage apparatus of a CMOS memory, wherein a memory cell array of said semiconductor storage apparatus is divided into a plurality of memory blocks, wherein each of said memory blocks comprises a sense amplifier for amplifying a data output signal from a memory cell, wherein a read signal from said sense amplifier of said memory block selected by a block select signal obtained by decoding an external address is transmitted via a read data bus to a data output circuit having a data latch circuit, said data read circuit comprising:

a PMOS transistor for being turned on and off in response to a read signal from said sense amplifier in a data reading stage when said sense amplifier is activated, said PMOS transistor disposed on each of said memory blocks, said PMOS transistor having a drain connected to said read data bus and a grounded source, wherein a second level signal is outputted to said read data bus by turning on said PMOS transistor when the read signal from said sense amplifier has a first level, while the read signal from said sense amplifier is stopped from being outputted to said read data bus by turning off said PMOS transistor when the read signal from said sense amplifier has a second level.

The above-mentioned data read circuit preferably further comprises:

a pull-up resistor for pulling up a signal line between said read data bus and said data output circuit to the first level;

a first switching circuit connected so as to be inserted between said read data bus and said signal line;

a second switching circuit for inverting an inputted signal and outputting an inverted signal, said second switching circuit connected so as to be inserted between said signal line and said data output circuit; and a control circuit for controlling said first and second switching circuits to turn on said first and second switching circuits for a predetermined second interval which is included in a first interval for which said sense amplifier is activated in a stage of reading data from said memory cell, said second interval being shorter than said first interval, wherein a second level signal outputted from said NMOS transistor is outputted to said data output circuit via said first and second switching circuits when said NMOS transistor is turned on for the second interval, while the first level signal on said signal line pulled up by said pull-up resistor is outputted to said data output circuit via said second switching circuit when said NMOS transistor is turned off.

The above-mentioned data read circuit preferably further comprises:

a pull-down resistor for pulling down a signal line between said read data bus and said data output circuit to the second level;

a first switching circuit connected so as to be inserted between said read data bus and said signal line;

a second switching circuit for inverting an inputted signal and outputting an inverted signal, said second switching circuit connected so as to be inserted between said signal line and said data output circuit and operates; and a control circuit for controlling said first and second switching circuits to turn on said first and second switching circuits for a predetermined second interval which is included in a first interval for which said sense amplifier is activated in a stage of reading data from said memory cell, said second interval being shorter than said first interval, wherein a first level signal outputted from said PMOS transistor is outputted to said data output circuit via said first and second switching circuits when said PMOS transistor is turned on in said second interval, while the second level signal on said signal line pulled down by said pull-down resistor is outputted to said data output circuit via said second switching circuit when said PMOS transistor is turned off.

The above-mentioned data read circuit preferably further comprises:

a temporary storage circuit for temporarily storing a level signal therein, said temporary connected so as to be inserted between said read data bus and said data output circuit;

a first switching circuit connected so as to be inserted between said read data bus and said temporary storage circuit;

a second switching circuit for inverting an inputted signal and outputting an inverted signal, said second switching circuit connected so as to be inserted between said temporary storage circuit and said data output circuit; and a control circuit for controlling said temporary storage circuit to preparatorily store a first level signal into said temporary storage circuit for an interval other than a first interval for which said sense amplifier is activated in a stage of reading data from said memory cell, and for controlling said first and second switching circuits to turn on said first and second switching circuits for a predetermined second interval which is included in said first interval and is shorter than said first interval, wherein a second level signal outputted from said NMOS transistor is outputted to said data output circuit via said first switching circuit, said temporary storage circuit and said second switching circuit when said NMOS transistor is turned on in said second interval, while the first level signal stored temporarily in said temporary storage circuit is outputted to said data output circuit via said second switching circuit when said NMOS transistor is turned off.

The above-mentioned data read circuit preferably further comprises:

a temporary storage circuit for temporarily storing a level signal therein, said temporary connected so as to be inserted between said read data bus and said data output circuit;

a first switching circuit connected so as to be inserted between said read data bus and said temporary storage circuit;

a second switching circuit for inverting an inputted signal and outputting an inverted signal, said second switching circuit connected so as to be inserted between said temporary storage circuit and said data output circuit; and a control circuit for controlling said temporary storage circuit to preparatorily store a second level signal into said temporary storage circuit for an interval other than a first interval for which said sense amplifier is activated in a stage of reading data from said memory cell, and for controlling said first and second switching circuits to turn on said first and second switching circuits for a predetermined second interval which is included in said first interval and is shorter than said first interval, wherein said first level signal outputted from said PMOS transistor is outputted to said data output circuit via said first switching circuit, said temporary storage circuit and said second switching circuit when said PMOS transistor is turned on in said second interval, while the second level signal stored temporarily in said temporary storage circuit is outputted to said data output circuit via said second switching circuit when said PMOS transistor is turned off.

The above-mentioned data read circuit preferably further comprises:

a level fixing circuit for fixing said read data bus to the second level for an interval other than said first interval, said level fixing circuit connected so as to be inserted between said read data bus and said first switching circuit.

The above-mentioned data read circuit preferably further comprises:

a level fixing circuit for fixing said read data bus to the first level for an interval other than said first interval, said level fixing circuit connected so as to be inserted between said read data bus and said first switching circuit.

In the above-mentioned data read circuit, said pull-up resistor preferably comprises a PMOS transistor having a gate to which the second level signal is applied.

In the above-mentioned data read circuit, said pull-down resistor preferably comprises an NMOS transistor having a gate to which the first level signal is applied.

The above-identified data read circuit preferably further comprises:

an inverter circuit for making an output terminal connected to said read data bus a high impedance in the stage of reading data from said memory cell, and for inverting a write data signal and transmitting an inverted write data signal via said read data bus to each of said memory blocks for an interval other than the stage of reading data from said memory cell, wherein said read data bus is commonly used as a write data bus.

According to a further aspect of the present invention, there is provided a semiconductor storage apparatus of a CMOS memory comprising:

a memory array having a plurality of memory cells, said plurality of memory cells divided into a plurality of memory blocks; and a data read circuit for use in said semiconductor storage apparatus, wherein a memory cell array of said semiconductor storage apparatus is divided into a plurality of memory blocks, wherein each of said memory blocks comprises a sense amplifier for amplifying a data output signal from a memory cell, wherein a read signal from said sense amplifier of said memory block selected by a block select signal obtained by decoding an external address is transmitted via a read data bus to a data output circuit having a data latch circuit, said data read circuit comprising:

an NMOS transistor for being turned on and off in response to a read signal from said sense amplifier in a data reading stage when said sense amplifier is activated, said NMOS transistor disposed on each of said memory blocks, said NMOS transistor having a drain connected to said read data bus and a grounded source, wherein a first level signal is outputted to said read data bus by turning on said NMOS transistor when the read signal from said sense amplifier has a first level, while the read signal from said sense amplifier is stopped from being outputted to said read data bus by turning off said NMOS transistor when the read signal from said sense amplifier has a second level.

In the above-mentioned semiconductor storage apparatus, said data read circuit preferably further comprises:

a pull-up resistor for pulling up a signal line between said read data bus and said data output circuit to the first level;

a first switching circuit connected so as to be inserted between said read data bus and said signal line;

a second switching circuit for inverting an inputted signal and outputting an inverted signal, said second switching circuit connected so as to be inserted between said signal line and said data output circuit; and a control circuit for controlling said first and second switching circuits to turn on said first and second switching circuits for a predetermined second interval which is included in a first interval for which said sense amplifier is activated in a stage of reading data from said memory cell, said second interval being shorter than said first interval, wherein a second level signal outputted from said NMOS transistor is outputted to said data output circuit via said first and second switching circuits when said NMOS transistor is turned on for the second interval, while the first level signal on said signal line pulled up by said pull-up resistor is outputted to said data output circuit via said second switching circuit when said NMOS transistor is turned off.

In the above-mentioned semiconductor storage apparatus, said data read circuit preferably further comprises:

a pull-down resistor for pulling down a signal line between said read data bus and said data output circuit to the second level;

a first switching circuit connected so as to be inserted between said read data bus and said signal line;

a second switching circuit for inverting an inputted signal and outputting an inverted signal, said second switching circuit connected so as to be inserted between said signal line and said data output circuit and operates; and a control circuit for controlling said first and second switching circuits to turn on said first and second switching circuits for a predetermined second interval which is included in a first interval for which said sense amplifier is activated in a stage of reading data from said memory cell, said second interval being shorter than said first interval, wherein a first level signal outputted from said PMOS transistor is outputted to said data output circuit via said first and second switching circuits when said PMOS transistor is turned on in said second interval, while the second level signal on said signal line pulled down by said pull-down resistor is outputted to said data output circuit via said second switching circuit when said PMOS transistor is turned off.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Preferred embodiments of the present invention will be described below with reference to the accompanying drawings.

First Preferred Embodiment

Figure 1:
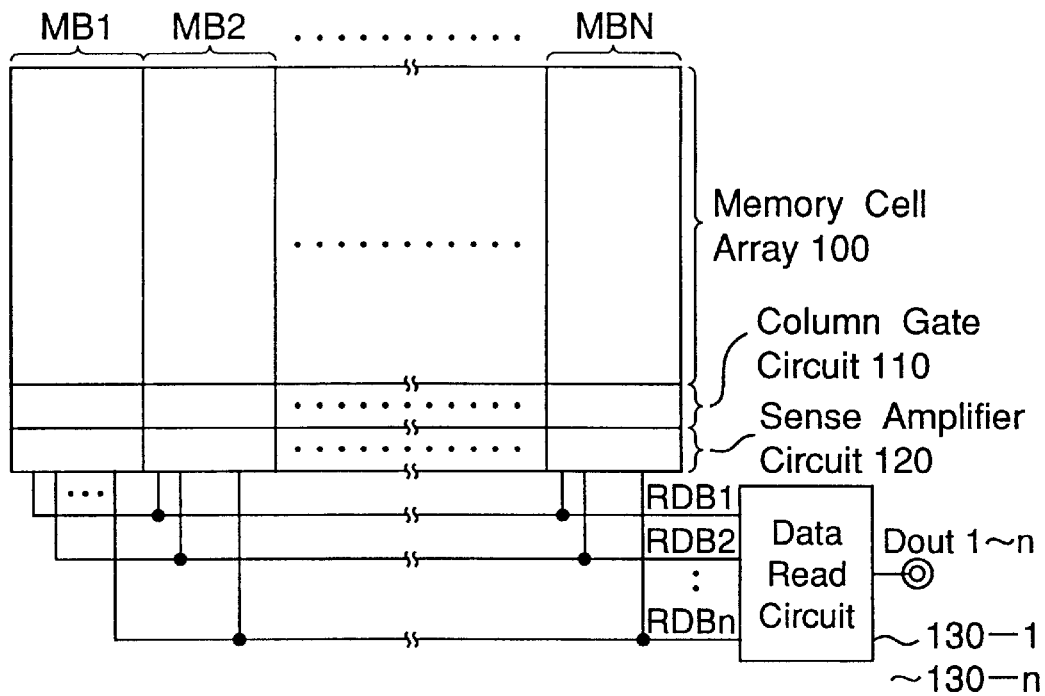
FIG. 1 is a block diagram of an SRAM of a CMOS memory according to a first preferred embodiment of the present invention.
Figure 2:
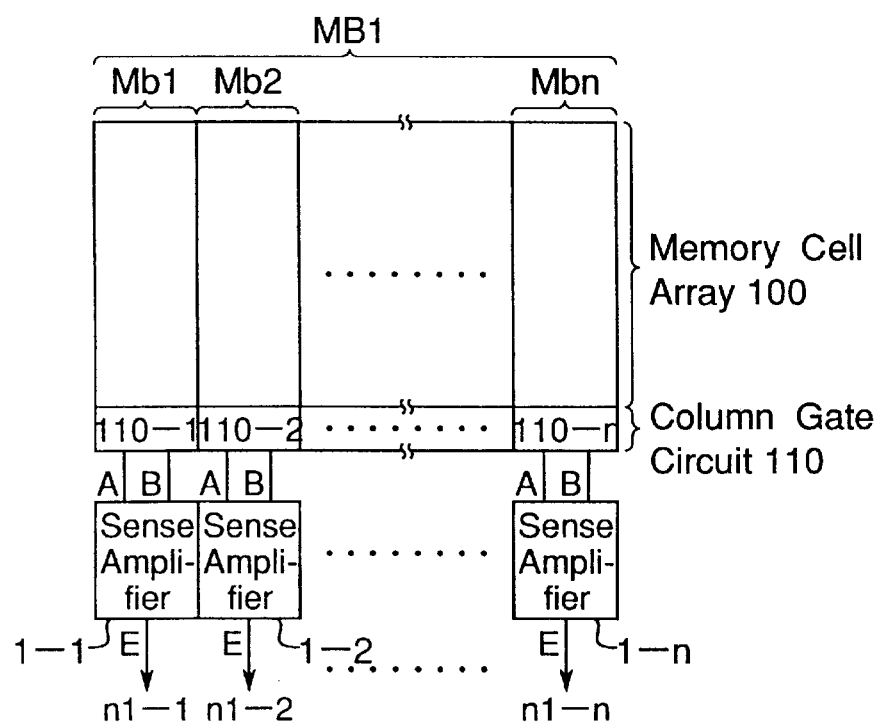
FIG. 2 is a block diagram of one memory block MB1 shown in FIG. 1.
Figure 3:
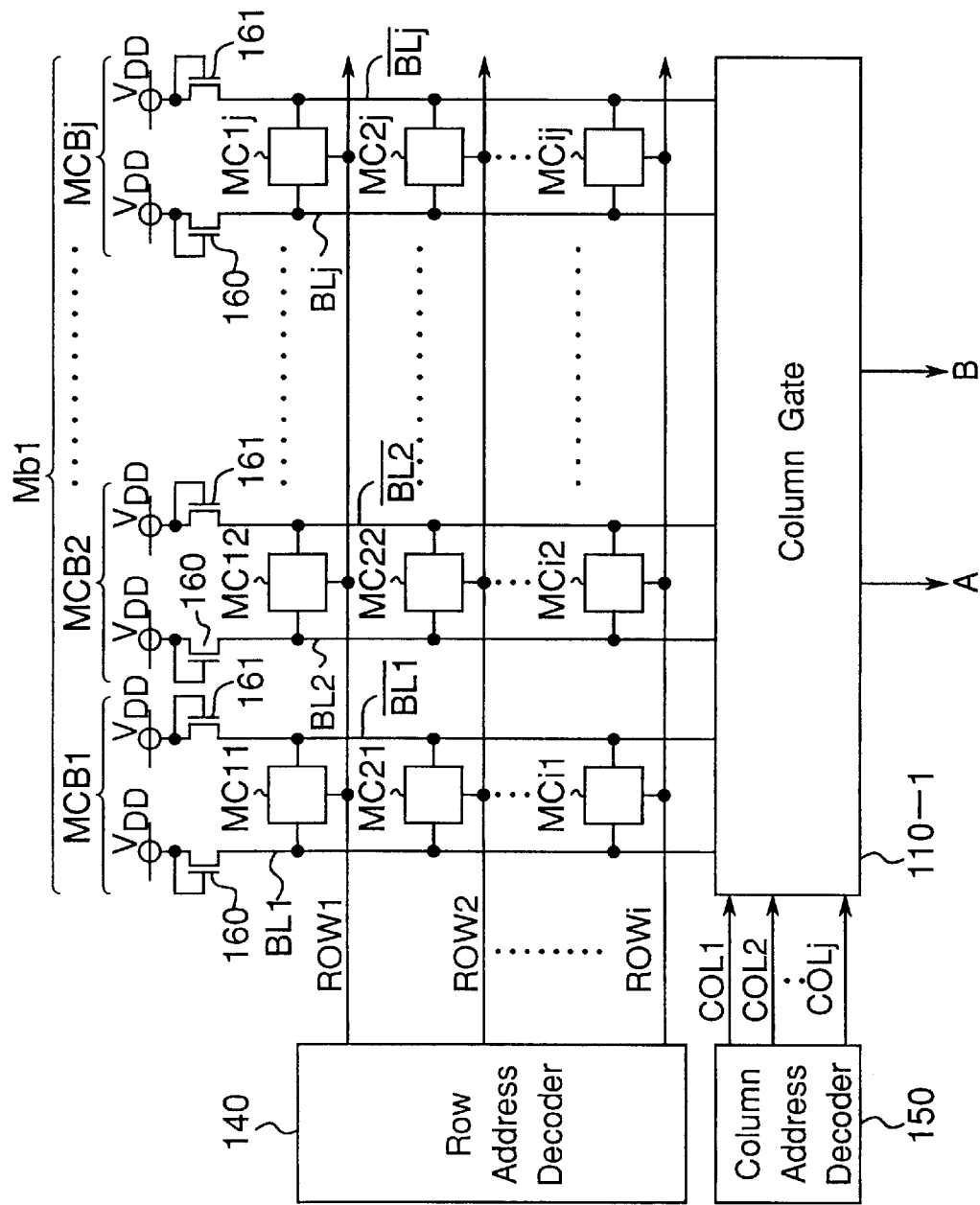
FIG. 3 is a block diagram of one memory sub-block Mb1 shown in FIG. 2 and its peripheral circuit.
Figure 4:
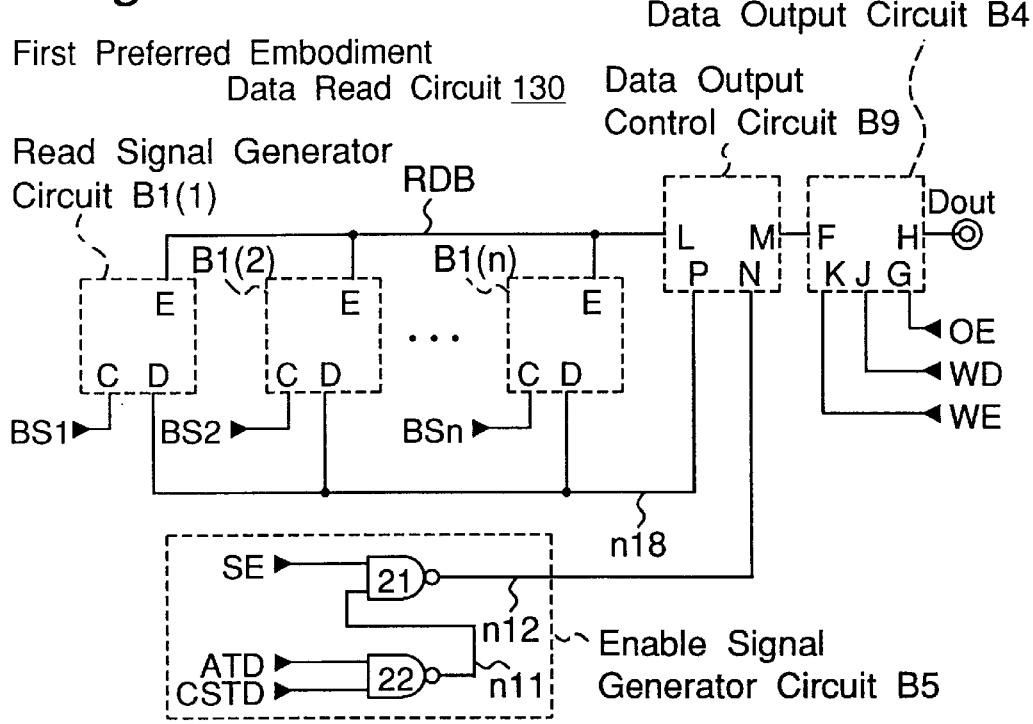
FIG. 4 is a block diagram of a data read circuit 130 shown in FIG. 1.
Figure 5:
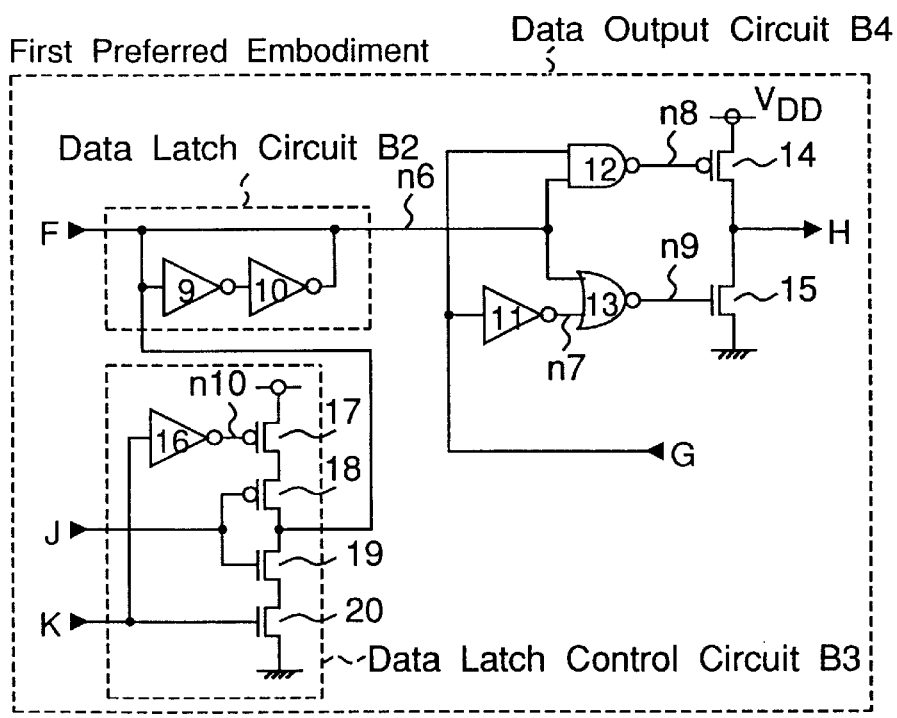
FIG. 5 is a block diagram of a data output circuit B4 shown in FIG. 4.
Figure 6:
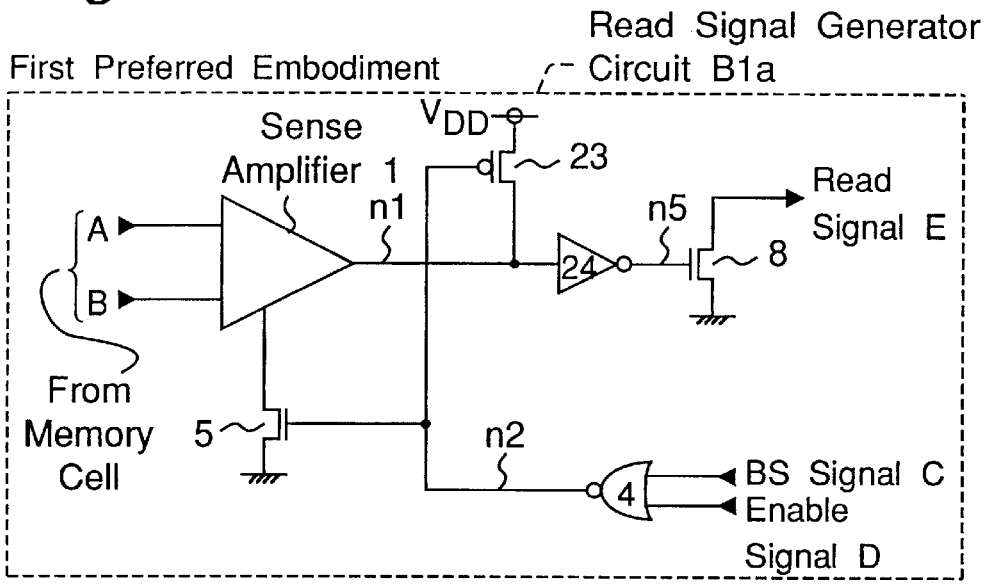
FIG. 6 is a block diagram of a read signal generator circuit B1*a* shown in FIG. 4.
Figure 7:
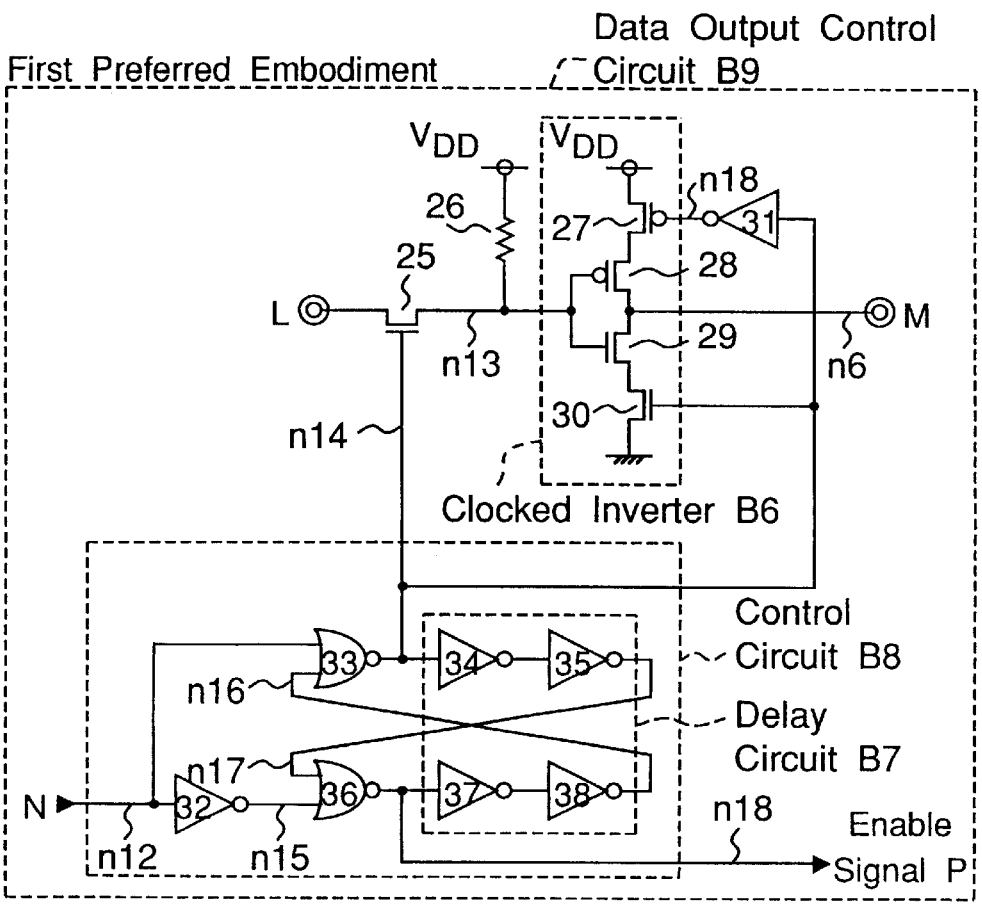
FIG. 7 is a block diagram of a data output control circuit B9 shown in FIG. 4.
Figure 8:
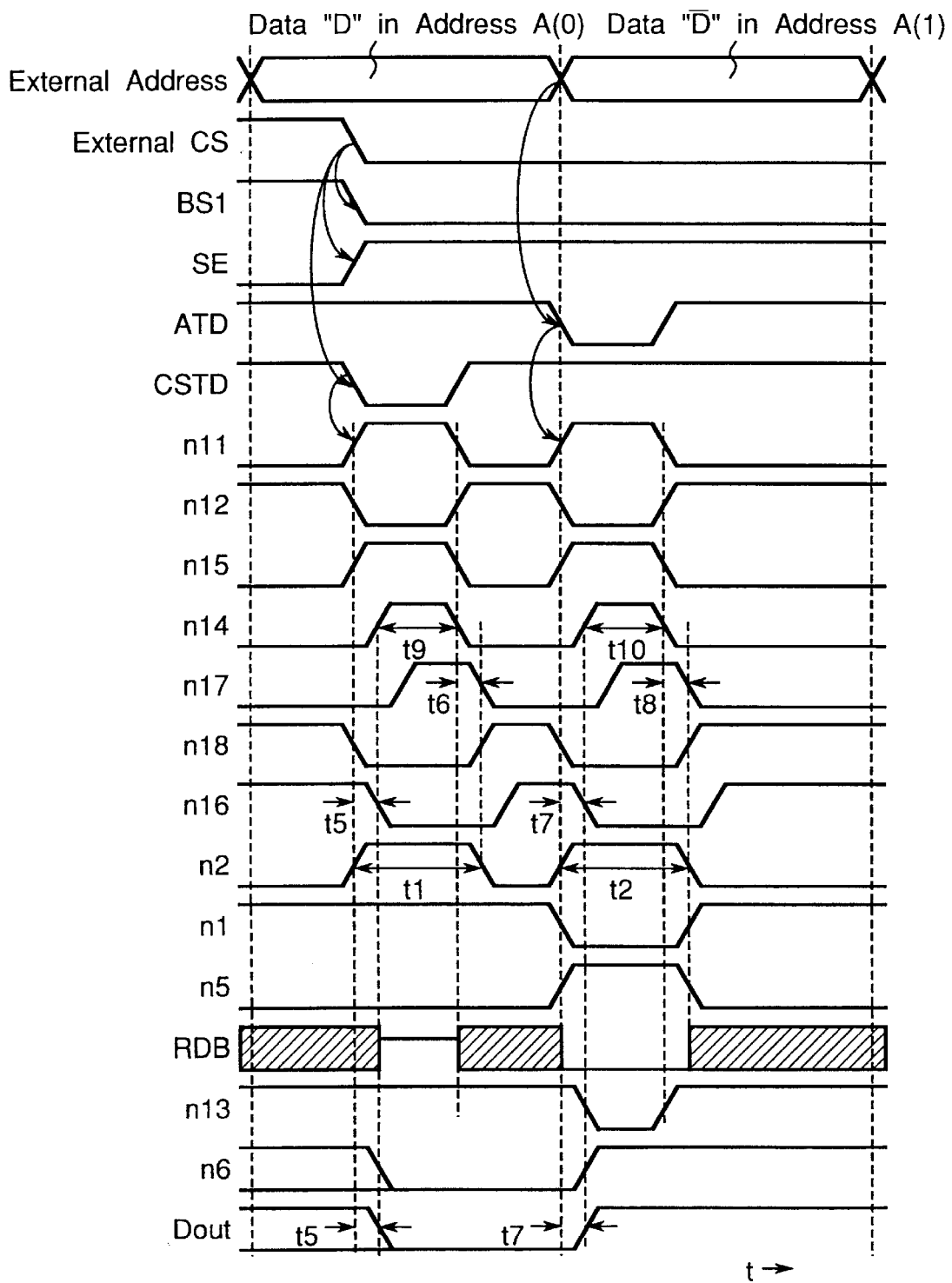
FIG. 8 is a timing chart showing an operation of an SRAM data read circuit shown in FIG. 4.

FIG. 1 is a block diagram of an SRAM of a CMOS memory according to a first preferred embodiment of the present invention, FIG. 2 is a block diagram of one memory block MB1 shown in FIG. 1, and FIG. 3 is a block diagram of one memory sub-block Mb1 shown in FIG. 2 and its peripheral circuit. Further, FIG. 4 is a block diagram of a sense amplifier circuit 120 connected to one read data bus RDB of RDB1 to RDBn and a data read circuit 130 shown in FIG. 1, FIG. 5 is a block diagram of a data output circuit B4 shown in FIG. 4, and FIG. 6 is a block diagram of a read signal generator circuit B1a shown in FIG. 4. Furthermore, FIG. 7 is a block diagram of a data output control circuit B9 shown in FIG. 4, and FIG. 8 is a timing chart showing an operation of the SRAM data read circuit shown in FIG. 4. In FIGS. 1 to 8, the components similar to those of the prior art shown in FIGS. 25 to 28 are denoted by the same reference numerals. For example, each reference numeral to which a suffix of a small alphabetical letter of "a" is attached as in the read signal generator circuit B1a shown in FIG. 6 means that its circuit construction has been slightly changed from that of the read signal generator circuit B1, and so forth in the following description. In this case, the SRAM data read circuit of the first preferred embodiment is characterized comprising a data output control circuit B9 between the SRAM read data bus RDB and the data output circuit B4 as shown in FIG. 4 in comparison with the prior art circuit shown in FIG. 24.

In the SRAM of the present preferred embodiment shown in FIG. 1, the SRAM is made of a CMOS memory. A memory cell array 100 is divided into a plurality of N memory blocks MB1 to MBN, and a column gate 110 and the sense amplifier circuit 120 are connected to each of the memory blocks MB1 to MBN. A read signal outputted from the sense amplifier circuit 120 is outputted from a data output terminal Dout via the read data bus RDB comprised of a plurality of n signal lines RDB1 to RDBn and the data read circuit 130. It is to be noted that the sense amplifier 1 of the sense amplifier circuit 120 is shown in the data read circuit 130 shown in FIG. 4 and the subsequent figures for simplicity of explanation.

A memory block MB1 shown in FIG. 2 is divided into a plurality of n memory sub-blocks Mb1 to Mbn, and column gates 110-1 to 110-n and sense amplifiers 1-1 to 1-n are connected to the respective memory sub-blocks Mb1 to Mbn. The other memory blocks MB2 to MBN are constructed in a manner similar to that of the memory block MB1.

The memory sub-block Mb1 shown in FIG. 3 is divided into memory cell blocks MCB1 to MCBn that are memory cell blocks of a plurality of j columns. In this case, (i×j) memory cells MC11 to MCij each for storing therein H-level or L-level binary data are arranged in a matrix form. A plurality of i word lines ROW1 to ROWi to which a row address signal obtained by decoding an external row address signal in a row address decoder 140 is outputted are formed parallel to the horizontal direction in FIG. 3, while a plurality of j pairs of bit lines BL1 to BLj and inverted bit lines $\overline{BL1}$ to $\overline{BLj}$ are formed in the vertical direction in FIG. 3. The memory cells MC11 to MCij are each connected to a pair of bit line and inverted bit line and connected to one word line. The bit lines BL1 to BLj and the inverted bit lines $\overline{BL1}$ to $\overline{BLj}$ have one end connected to NMOS transistors 160 and 161 which constitute a pull-up resistor with their gates connected to a power source $V_{DD}$ for pulling up the bit lines and the inverted bit lines to the H level and have the other end connected to a column gate circuit 110-1 controlled by a column address signal obtained by decoding an external column address signal in a column address decoder 150.

Accordingly, the row address decoder 140 selects one word line in response to the external row address signal, while the column gate circuit 110-1 selects a pair of bit line and inverted bit line from the plurality of j pairs of bit lines and inverted bit lines, thereby selecting one memory cell. A data read signal transmitted from the selected memory cell via the selected pair of bit line and inverted bit line is outputted to the sense amplifier 1-1 shown in FIG. 2. Further, the memory sub-blocks Mb2 to Mbn are constructed in a manner similar to that of the memory sub-block Mb1.

In the data read circuit 130 shown in FIG. 4, each of the reference numerals B1(1) to B1(n) is the read signal generator circuit B1a having the construction shown in FIG. 6, and the read signal generator circuit B1a is a circuit which is provided with a sense amplifier 1 for amplifying an output signal from the memory cell every memory sub-block and outputs a data read signal outputted from the sense amplifier 1 in one memory sub-block selected by BS1 signal to BSn signal obtained by decoding an external address signal in an SRAM apparatus to the read data bus RDB. The reference numeral B5 denotes a circuit which outputs an enable signal for activating the sense amplifier 1 in the data reading stage via the data output control circuit B9 to the read signal generator circuits B1(1) to B1(n) and is comprised of NAND gates 21 and 22. The reference numeral B4 denotes a data output circuit having a data latching function. The data output circuit B4 temporarily stores therein read data inputted from the read signal generator circuit B1a of each memory block via the read data bus RDB, and then, outputs the data based on the OE signal, the WE signal and the WD signal.

Figure 26:
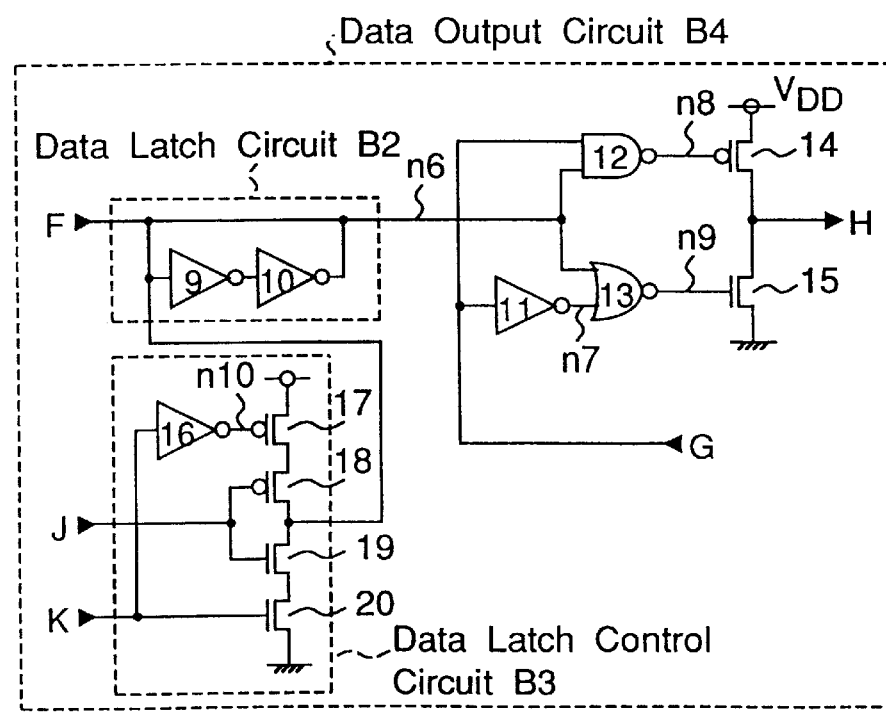
FIG. 26 is a block diagram of a data output circuit B4 shown in FIG. 25.

A data output circuit B4 shown in FIG. 5 has a circuit identical to that of the prior art data output circuit B4 shown in FIG. 26.

The read signal generator circuit B1a shown in FIG. 6 is characterized in that an NMOS transistor 8 is provided in its output circuit of a read signal E. In FIG. 6, a signal outputted from a NOR gate 4 which receives the inputs of a BS signal C and an enable signal D is applied to the gate of an NMOS transistor 5 which enables the operation of the sense amplifier 1 and applied to the gate of a PMOS transistor 23 for pulling up the level at a node n1 of the output terminal of the sense amplifier 1 to the H level. In this case, a power source $V_{DD}$ having an H-level voltage is connected to the node n1 via the source and the drain of the PMOS transistor 23. A read signal outputted from the sense amplifier 1 is applied to the gate of the NMOS transistor 8 via an inverter 24. The source of the NMOS transistor 8 is grounded, and its drain is connected to the read data bus RDB for transmitting the data read signal. Therefore, when the NMOS transistor 8 is turned on, the read data bus RDB connected to its drain comes to have the L level that is the ground potential. When the NMOS transistor 8 is turned off, the read data bus RDB comes to have a high impedance so as to stop the read signal outputted from the sense amplifier 1 via the inverter 24 from being outputted to the read data bus RDB.

In the read signal generator circuit B1a constructed as above, when both of the input signals C and D, which are the BS signal C and the enable signal D respectively, come to have the L level, the output of the NOR gate 4 comes to have the H level. Consequently, the PMOS transistor 23 is turned off, the NMOS transistor 5 is turned on, and the sense amplifier 1 is activated. When the sense amplifier 1 is activated, the sense amplifier 1 differentially amplifies input signals A and B from the I/O lines of the memory cell, and the inverted amplified signal is applied to the gate of the NMOS transistor 8 via the node n1 and the inverter 24. In this stage, the node n5 comes to have either the H level or the L level. When the node n5 is at the H level, the NMOS transistor 8 is turned on and an L-level signal is outputted to the read data bus RDB. When the node n5 is at the L level, the NMOS transistor 8 is turned off and the output state of the output signal E comes to have a high impedance. Further, when either one of the input signals C and D comes to have the H level, the node n2 comes to have the L level, when the sense amplifier 1 is deactivated. At the same time, the PMOS transistor 23 is turned on, and the H-level voltage of the power source $V_{DD}$ is applied to the node n1 via the source and the drain of the PMOS transistor 23. This H-level signal is applied to the gate of the NMOS transistor 8 via the inverter 24. Consequently, the node n5 comes to have the L level, the NMOS transistor 8 is turned off, and the output state of the output signal E comes to have a high impedance.

In FIG. 7, the data output control circuit B9 is provided with a clocked inverter B6 which is a switching circuit that is connected between a node n13 and an output terminal M and operates to invert an inputted signal and output the resulting signal, an inverter 31, a control circuit B8 provided with a delay circuit B7, an NMOS transistor 25 which is a switching circuit that is connected between the read data bus RDB and the clocked inverter B6 and disconnects the clocked inverter B6 from the read data bus RDB, and a pull-up resistor 26 which has a sufficiently greater resistance value than the ON-resistance of the NMOS transistor 8 for the purpose of pulling up the node n13 to the H level.

In this case, the clocked inverter B6 is comprised of a CMOS inverter provided with PMOS transistors 27 and 28 and NMOS transistors 29 and 30. When a node n14 that is the output node of the control circuit B8 is at the H level, the clocked inverter B6 is activated to invert the level signal at the node n13 and output the resulting signal to the output terminal M. When the node n14 is at the L level, the clocked inverter B6 is deactivated, and its output state to the output terminal M comes to have a high impedance. When the node n14 is at the H level, the NMOS transistor 25 is turned on and a conductive state is provided between an input terminal L and the node n13. When the node n14 is at the L level, conversely a non-conductive state is provided between the input terminal L and the node n13. The control circuit B8 is a circuit for controlling the operations of the clocked inverter B6 and the NMOS transistor 25 and controlling the operation of the sense amplifier 1 by generating an output enable signal P. When the sense amplifier 1 is activated, the clocked inverter B6 is activated and the NMOS transistor 25 is turned on. When the sense amplifier 1 is deactivated, the clocked inverter B6 is deactivated and the NMOS transistor 25 is turned off. It is to be noted that the node n13 is connected to the power source $V_{DD}$ via the pull-up resistor 26 to be pulled up to the H level.

An enable signal N outputted from the enable signal generator B5 shown in FIG. 4 is inputted to a first input terminal of a NOR gate 33 of the control circuit B8, and inputted to a second input terminal of a NOR gate 36 via an inverter 32. An output signal from the NOR gate 33 is inputted to a first input terminal of the NOR gate 36 via a delay circuit comprised of two inverters 34 and 35 connected in series with each other, while an output signal from the NOR gate 36 is inputted to a second input terminal of the NOR gate 33 via a delay circuit comprised of two inverters 37 and 38 connected in series with each other. Then, an output signal from the NOR gate 33 is applied to the gate of the NMOS transistor 25 via the node n14, while an output signal from the NOR gate 36 is outputted as the enable signal P to the read signal generator circuit B1a of each memory block.

The timing chart of FIG. 8 shows an operation of reading data in two cycles with external addresses of an address A(0) and an address A(1) for the reading of data from the address A(0) and the address A(1), and it is assumed that data different from each other have been preparatorily written in the address A(0) and the address A(1) (e.g., when the data stored in the address A(0) is "0" (or L-level data), the data stored in the address A(1) is "1" (H-level data)). It is further assumed that the data stored in the address A(0) and the data stored in the address A(1) are each outputted from the read signal generator circuit B1(1) shown in FIG. 4. It is further assumed that the input signal G is fixed to the H level and the input signal K is fixed to the L level in FIG. 5.

A read operation of the first preferred embodiment will be described below with reference to FIG. 8.

When the external CS signal comes to have the L level upon reading the data stored in the address A(0), the BS1 signal comes to have the L level, and the memory block of the read signal generator circuit B1(1) is selected to be activated. An SE signal for selecting between writing and reading comes to have the H level, and the data stored in the memory block of the read signal generator circuit B1(1) is permitted to be read. Further, in response to a trailing edge of the external CS signal, a CSTD signal that is a negative pulse signal is generated, and the CSTD signal is applied via the NAND gate 22 to the node n11 as shown in FIG. 4. A positive pulse signal is generated at the node n11, and the positive pulse signal is applied via the NAND gate 21 to the node n12. A negative pulse signal is generated at the node n12, and the negative pulse signal is applied via the inverter 32 to the node n15 as shown in FIG. 7, so that a positive pulse signal is generated at the node n15.

The negative pulse signal at the node n12 and the positive pulse signal at the node n15 operate as follows in the control circuit B8, as a consequence of which a positive pulse signal is outputted at the node n14 and a negative pulse signal is outputted at a node n18. In response to the rise of the positive pulse at the node n15, the node n18 comes to have the L level, and a node n16 comes to have the L level after a lapse of a delay time t5 due to the inverters 37 and 38. The L-level signal is applied via the NOR gate 33 to the node n14, as a consequence of which the node n14 comes to have the H level. In response to the rise or leading of the negative pulse at the node n12, the node n14 comes to have the L level, and a node n17 comes to have the L level after a lapse of a delay time t6 due to the inverters 34 and 35. The L-level signal is applied via the NOR gate 36 to the node n18, as a consequence of which the node n18 comes to have the H level.

The negative pulse signal at the node n18 is applied via the NOR gate 4 to the node n2, as a consequence of which a positive pulse signal is outputted at the node n2. For the interval t1 for which the positive pulse signal is generated at the node n2, the sense amplifier 1 is activated, and an H-level signal is outputted as data stored in the address A(0) to the node n1. The H-level signal is applied via the inverter 24 to the node n5, as a consequence of which the node n5 comes to have the L level. In this stage, the NMOS transistor 8 is turned off, and the output state to the read data bus RDB comes to have a high impedance. Further, the node n13 is connected to the power source $V_{DD}$ via the pull-up resistor 26 so that it is pulled up to the H level. The NMOS transistor 25 is turned on for an interval t9 for which a positive pulse signal is generated at the node n14 to activate the clocked inverter B6, and an L-level signal is outputted to the node n6. In this stage, the L-level signal is stored into the data latch circuit B2, and an L-level signal is outputted to the external output terminal Dout. It is to be noted that a level signal that is lower than the H level by a threshold value Vth of the NMOS transistor 25 is outputted to the read data bus RDB for the interval t9. The level signal has no direct relation with the data output to the external output terminal Dout. For an interval other than the interval t9 and an interval t2 as described later, the level of the read data bus RDB is undefined as indicated by the hatched portions in FIG. 8. Therefore, on the read data bus RDB, there is effected no full-swing change from the L level to the H level or from the H level to the L level.

Thus, the control circuit B8 executes control so that it generates a positive pulse signal at the node n14 for the intervals t9 and t10 for the intervals t1 and t2 for which the positive pulse signal is generated at the node n2 and the sense amplifier 1 is activated, i.e., it turns on the NMOS transistor 25 and activates the clocked inverter B6 for the interval t9 that is included in a center portion of the interval t1 and is shorter than the interval t1 and for the interval t10 that is included in a center portion of the interval t2 and is shorter than the interval t2, thereby playing the role of preventing erroneous data read in another address in the next cycle. It is to be noted that the delay times t5, t6, t7 and t8 can be adjusted by changing the number of stages of the inverters 34, 35, 37 and 38 of the delay circuit B7.

Upon reading the data stored in the address A(1), an ATD signal that is a negative pulse signal is generated in response to the change of the external address signal, and the ATD signal is applied via the NAND gate 22 to the node n11. Consequently, a positive pulse signal is generated at the node n11, the positive pulse signal is applied via the NAND gate 21 to the node n12, as a consequence of which a negative pulse signal is generated at the node n12. Subsequently, the sense amplifier 1 is activated for the interval t2 in a manner similar to that of the data read in the address A(0), and an L-level signal is outputted as data stored in the address A(1) to the node n1. The L-level signal is applied via the inverter 24 to the node n5, as a consequence of which the node n5 comes to have the H level, by which the NMOS transistor 8 is turned on, and an L-level signal is outputted to the read data bus RDB. For the interval t10 for the interval t2 for which the positive pulse signal is generated at the node n2 to activate the sense amplifier 1, a positive pulse signal is generated at the node n14. That is, for the interval t10 that is included in the center portion of the interval t2 and is set so as to be shorter than the interval t2, the NMOS transistor 25 is turned on and the clocked inverter B6 is activated. In this stage, the resistance value of the pull-up resistor 26 is set so as to be sufficiently greater than the ON-resistance of the NMOS transistor 8, and therefore, the node n13 comes to have the L level as a consequence of the event that the NMOS transistor 8 is turned on. The L-level signal is applied via the clocked inverter B6 to the node n6, and an H-level signal is outputted to the node n6. Then, the H-level signal is temporarily stored in the data latch circuit B2, and an H-level signal is outputted to the external output terminal Dout. Further, for the interval t10, a through current or penetrating current is generated from the power source $V_{DD}$ via the pull-up resistor 26, NMOS transistor 25, read data bus RDB and NMOS transistor 8 to the grounding terminal. However, the through current can be made infinitesimal by making the resistance value of the pull-up resistor 26 sufficiently great.

Figure 27:
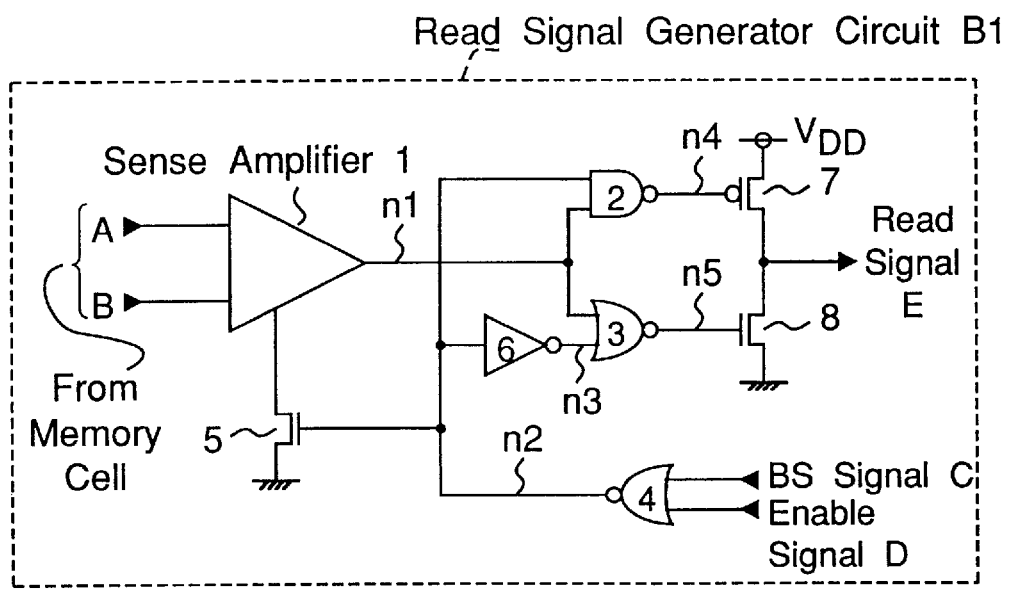
FIG. 27 is a block diagram of a read signal generator circuit B1 shown in FIG. 25.
Figure 28:
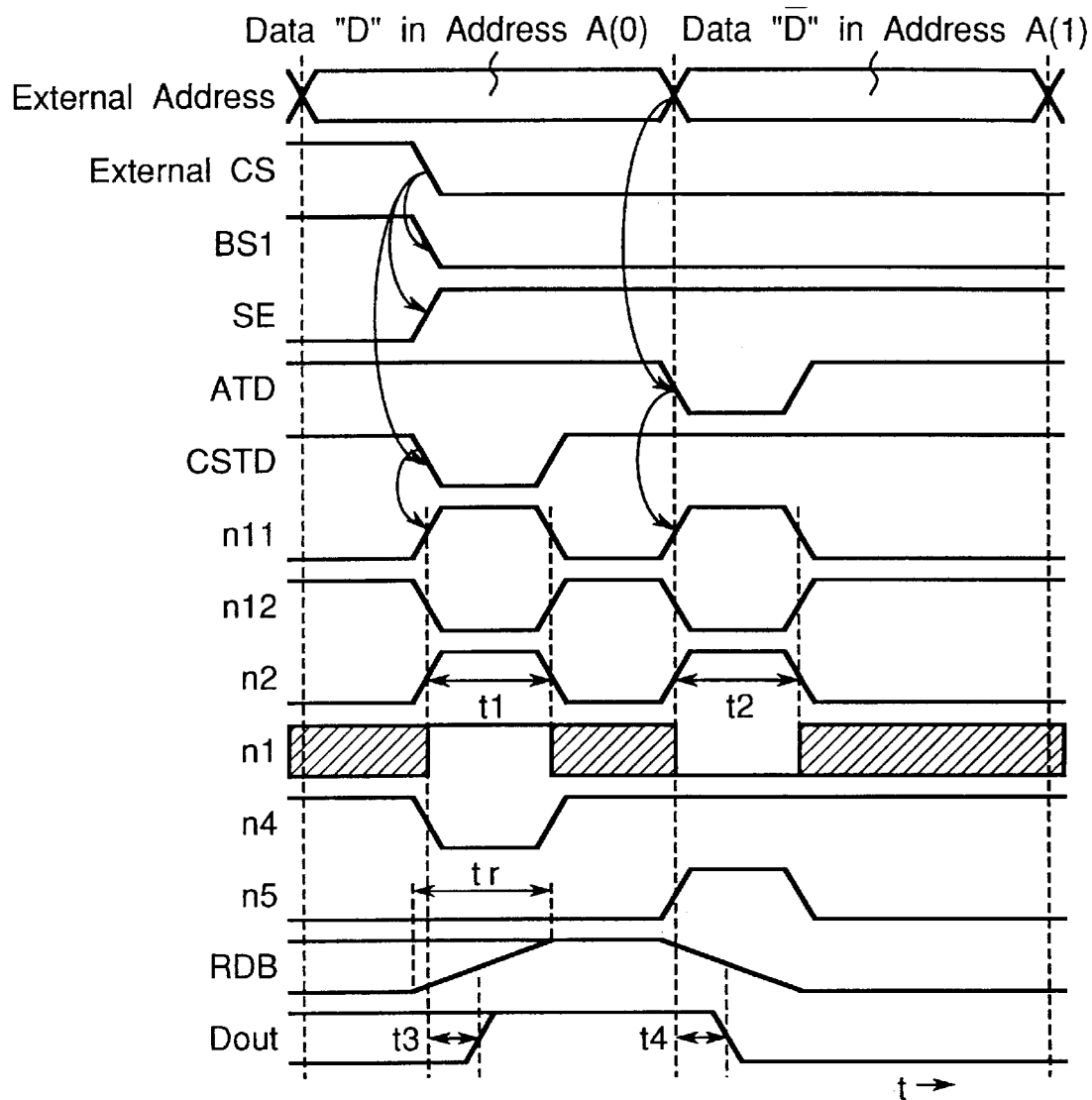
FIG. 28 is a timing chart showing an operation of the prior art SRAM data read circuit shown in FIG. 25.

As described above, in contrast to the prior art in which the read data bus RDB is driven by the CMOS inverter shown in FIG. 27, the present preferred embodiment has the construction as follows. That is, the driver capacity of the read data bus RDB is reduced by driving the read data bus RDB by means of the NMOS transistor 8, and the delay time of the read signal on the read data bus RDB is remarkably reduced by not effecting the full swing of the level of the read data bus RDB from the H level to the L level or from the L level to the H level. With this arrangement, the data read operation speed can be increased without any erroneous read, and the charge and discharge currents of the read data bus RDB can be reduced further than those of the prior art, thereby allowing the consumption power to be remarkably reduced.

Second Preferred Embodiment

Figure 9:
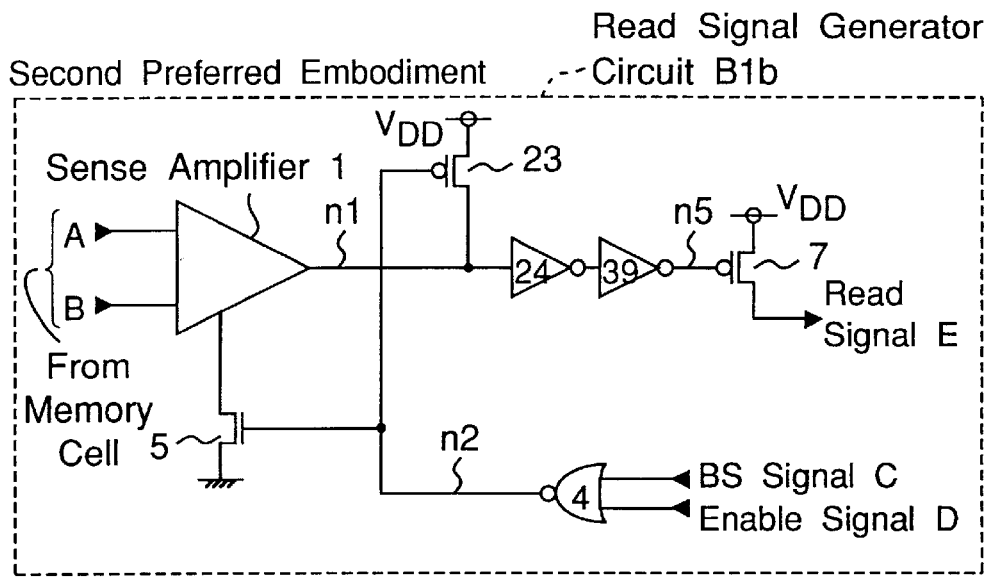
FIG. 9 is a block diagram of a read signal generator circuit B1*b* of the SRAM data read circuit according to a second preferred embodiment of the present invention.
Figure 10:
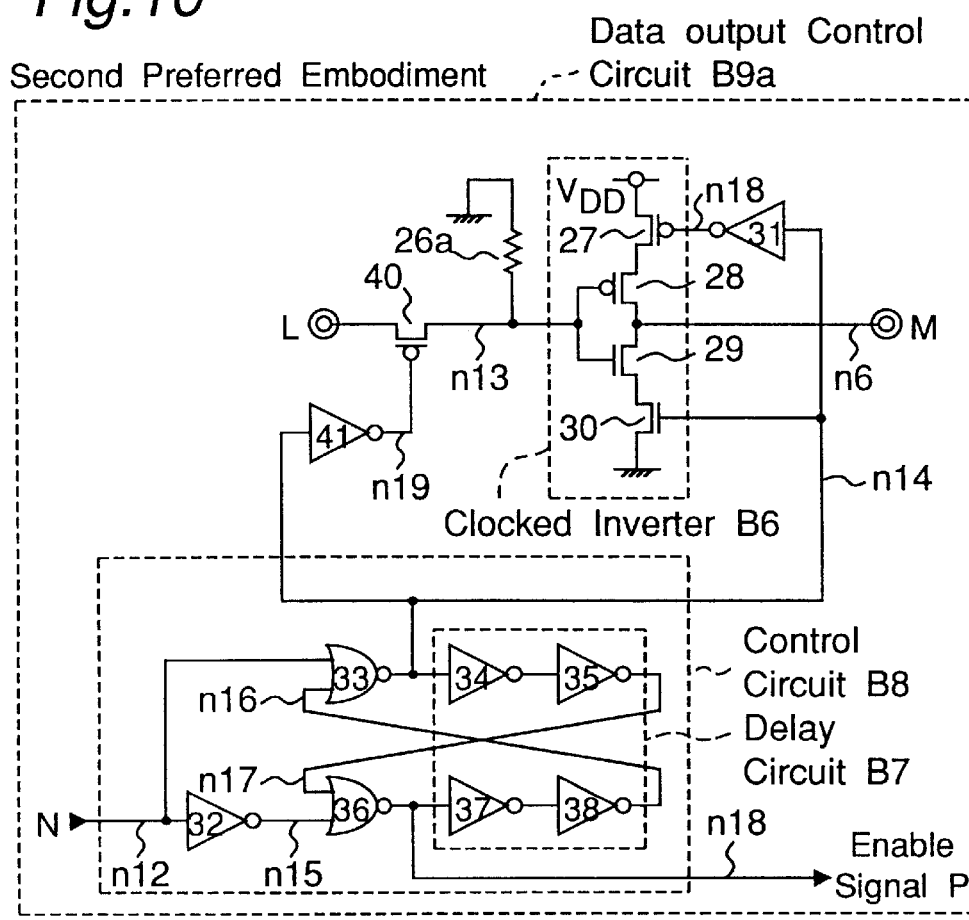
FIG. 10 is a block diagram of a data output control circuit B9a of the SRAM data read circuit of the second preferred embodiment.
Figure 11:
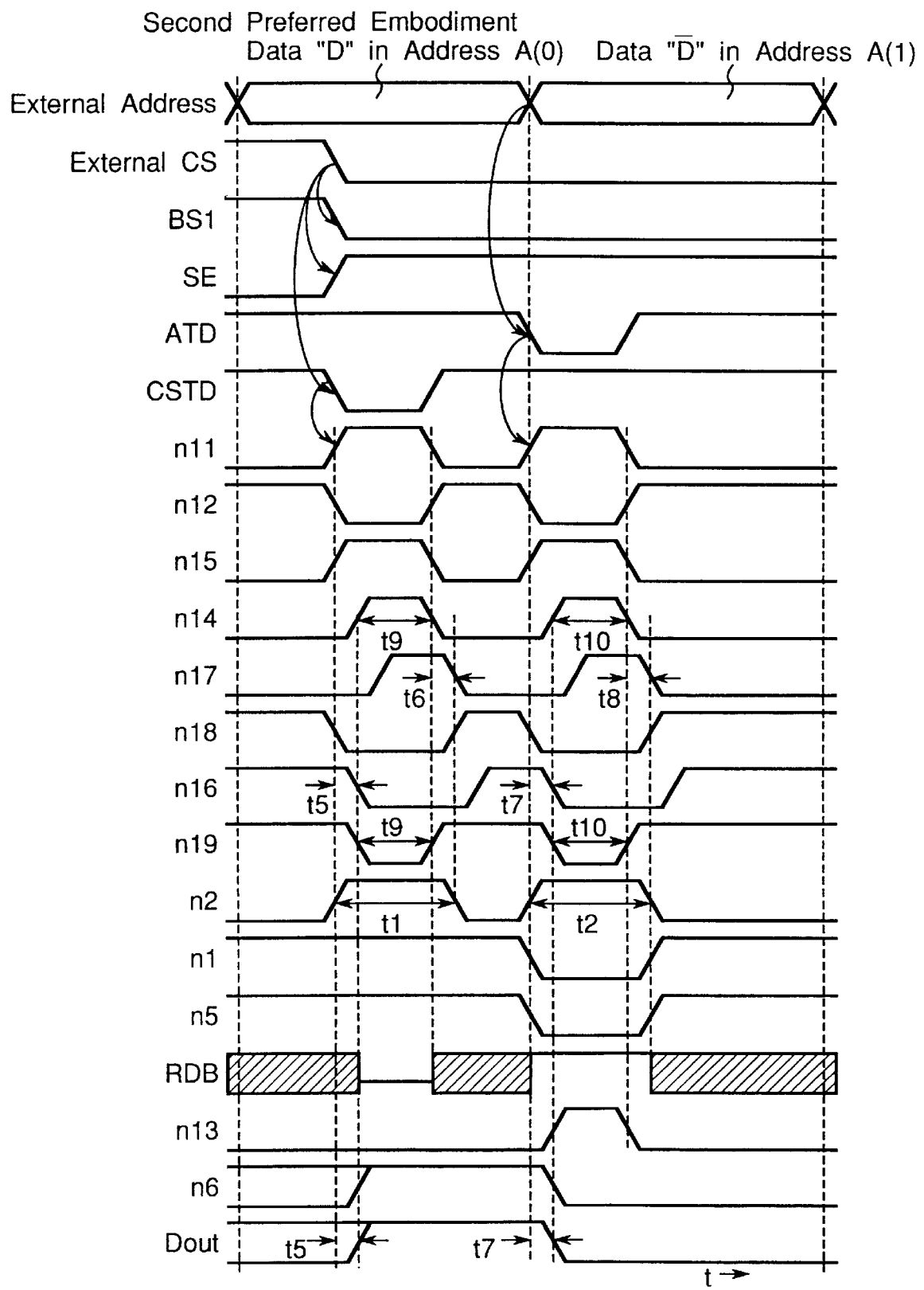
FIG. 11 is a timing chart showing an operation of the SRAM data read circuit of the second preferred embodiment.

FIG. 9 is a block diagram of a read signal generator circuit B1b of the SRAM data read circuit according to a second preferred embodiment of the present invention, FIG. 10 is a block diagram of a data output control circuit B9a of the SRAM data read circuit of the second preferred embodiment, and FIG. 11 is a timing chart showing an operation of the SRAM data read circuit of the second preferred embodiment. The second preferred embodiment differs from the first preferred embodiment in the following points:

(a) A PMOS transistor 7 as shown in FIG. 9 is provided in place of the NMOS transistor 8 shown in FIG. 6. In accordance with this, as shown in FIG. 9, an inverter 39 is inserted between the inverter 24 and the gate of the PMOS transistor 7.

(b) A PMOS transistor 40 as shown in FIG. 10 is provided in place of the NMOS transistor 25 shown in FIG. 7. In accordance with this, as shown in FIG. 10, an inverter 41 is inserted between the node n14 and the gate of the PMOS transistor 40.

(c) A pull-down resistor 26a for pulling down the node n13 to the L level is provided in place of the pull-up resistor 26 shown in FIG. 7. In this case, the node n13 is grounded via the pull-down resistor 26a. The resistance value of the pull-down resistor 26a is set so as to be sufficiently greater than the ON-resistance of the PMOS transistor 7.

In FIG. 9, a read signal from the sense amplifier 1 is applied via the inverters 24 and 39 to the gate of the PMOS transistor 7, and the power source $V_{DD}$ is connected via the source and the drain of the PMOS transistor 7 to the read data bus RDB for transmitting the read signal E. Therefore, when the PMOS transistor 7 is turned on, an H-level signal is outputted to the read data bus RDB. When the PMOS transistor 7 is turned off, the read data bus RDB comes to have a high impedance, and the read signal outputted from the sense amplifier 1 via the inverters 24 and 39 is not outputted to the read data bus RDB.

In the read signal generator circuit B1b constructed as above, when both of the input signals C and D come to have the L level, the output of the NOR gate 4 comes to have the H level, the PMOS transistor 23 is turned off, the NMOS transistor 5 is turned on, and the sense amplifier 1 is activated. When the sense amplifier 1 is activated, the input signals A and B are differentially amplified and outputted to the node n1. The differentially amplified read signal is applied via the inverters 24 and 39 to the node n5, and the node n5 comes to have either the H level or the L level. When the node n5 is at the L level, the PMOS transistor 7 is turned on, and the H level is outputted to the read data bus RDB. When the node n5 is at the H level, the PMOS transistor 7 is turned off, and the output state of the output signal E comes to have a high impedance. When either one of the input signals C and D comes to have the H level, the node n2 comes to have the L level, the sense amplifier 1 is deactivated, the PMOS transistor 23 is turned on, and the H level is outputted to the node n1. The H-level signal is applied via the inverters 24 and 39 to the node n5. Consequently, the node n5 comes to have the H level, the PMOS transistor 7 is turned off, and the output state of the output signal E comes to have a high impedance.

In FIG. 10, the clocked inverter B6 and the control circuit B8 have constructions and operations similar to those of the first preferred embodiment. Further, when the node n14 is at the H level, an H-level signal is applied via the inverter 41 to a node n19, as a consequence of which the node n19 comes to have the L level, the PMOS transistor 40 is turned on, and a conductive state is provided between the input terminal L and the node n13. When the node n14 is at the L level, conversely a non-conductive state is provided between the input terminal L and the node n13.

The timing chart of FIG. 11 shows an operation of reading data in two cycles with external addresses of an address A(0) and an address A(1) for the reading of data from the address A(0) and the address A(1), and it is assumed that data different from each other have been preparatorily written in the address A(0) and the address A(1) (e.g., when the data stored in the address A(0) is "0", the data stored in the address A(1) is "1"). It is further assumed that the data stored in the address A(0) and the data stored in the address A(1) are each outputted from the read signal generator circuit B1(1) shown in FIG. 4. It is further assumed that the input signal G is fixed to the H level and the input signal K is fixed to the L level in FIG. 5.

A read operation of the second preferred embodiment will be described with reference to FIG. 11.

When the external CS signal comes to have the L level upon reading the data stored in the address A(0), the BS1 signal comes to have the L level, and the memory block of the read signal generator circuit B1(1) is selected to be activated. An SE signal for selecting between writing and reading comes to have the H level, and the data stored in the memory block of the read signal generator circuit B1(1) is permitted to be read. Further, in response to a trailing edge of the external CS signal, a CSTD signal that is a negative pulse signal is generated, and the CSTD signal is applied via the NAND gate 22 to the node n11. A positive pulse signal is generated at the node n11, and the positive pulse signal is applied to the node n12 via the NAND gate 21. A negative pulse signal is generated at the node n12, and the negative pulse signal is applied to the node n15 via the inverter 32, so that a positive pulse signal is generated at the node n15.

The negative pulse signal at the node n12 and the positive pulse signal at the node n15 operate in the control circuit B8 in a manner similar to that of the first preferred embodiment, as a consequence of which a positive pulse is outputted to the node n14, and a negative pulse signal is outputted to the node n18. The positive pulse signal at the node n14 is applied via the inverter 41 to the node n19, and a negative pulse signal is generated at the node n19.

The negative pulse signal at the node n18 is applied via the NOR gate 4 to the node n2, as a consequence of which a positive pulse signal is outputted at the node n2. For the interval t1 for which the positive pulse signal is generated at the node n2, the sense amplifier 1 is activated, and an H-level signal is outputted as the data stored in the address A(0) to the node n1. The H-level signal is applied to the node n5 via the inverters 24 and 39, as a consequence of which the node n5 comes to have the H level. The PMOS transistor 7 is turned off, and the output state to the read data bus RDB comes to have a high impedance. Further, the node n13 is at the L level due to the pull-down resistor 26a, the PMOS transistor 40 is turned on for an interval t9 for which a negative pulse signal is generated at the node n19, and the clocked inverter B6 is activated. By this operation, an H-level signal is outputted at the node n6, the H-level signal is stored into the data latch circuit B2, and an H-level signal is outputted to the external output terminal Dout. It is to be noted that a level signal that is higher than the L level by the threshold value Vth of the PMOS transistor 40 of the read data bus RDB is outputted. However, the level signal has no direct relation with the data output to the external output terminal Dout, and the level of the read data bus RDB is undefined for an interval other than the interval t9 and the interval t2 as described later. Therefore, on the read data bus RDB, there is effected no full swing change from the L level to the H level or from the H level to the L level.

Thus, the control circuit B8 executes control so that it generates a positive pulse signal at the node n14 for the interval t9 that is included in the center portion of the interval t1 and is shorter than the interval t1 and for the interval t10 that is included in the center portion of the interval t2 and shorter than the interval t2, for each of these intervals a positive pulse signal is generated at the node n2 and the sense amplifier 1 is activated, thereby turning on the NMOS transistor 25 and activating the clocked inverter B6 and playing the role of preventing the erroneous read of data in another address in the next cycle. The delay times t5, t6, t7 and t8 are made adjustable by changing the number of steps of the inverters of the delay circuit B7.

Upon reading the data stored in the address A(1), an ATD signal that is a negative pulse signal is generated in response to the change of the external address signal, and the ATD signal is applied via the NAND gate 22 to the node n11, and a positive pulse signal is generated at the node n11. The positive pulse signal is applied via the NAND gate 21 to the node n12, and a negative pulse signal is generated at the node n12. Subsequently, the sense amplifier 1 is activated for the interval t2 in a manner similar to that of the read operation of data stored in the address A(0), and an L-level signal is outputted as the data stored in the address A(1) to the node n1. The L-level signal is applied via the inverters 24 and 39 to the node n5, and the node n5 comes to have the L level, by which the PMOS transistor 7 is turned on and an H-level signal is outputted to the read data bus RDB. A positive pulse signal is generated at the node n2 to activate the sense amplifier 1. For the interval t10 that is included in the center portion of the interval t2 and is shorter than the interval t2, a negative pulse signal is generated at the node n19, by which the PMOS transistor 40 is turned on and the clocked inverter B6 is activated. In this stage, the resistance value of the pull-down resistor 26a is made sufficiently greater than the ON-resistance of the PMOS transistor 7, and therefore, the node n13 comes to have the H level as a consequence of the event that the PMOS transistor 7 is turned on. The H-level signal is outputted via the clocked inverter B6 to the node n6, and an L-level signal is outputted to the node n6. The L-level signal is temporarily stored in the data latch circuit B2, and an L-level signal is outputted to the external output terminal Dout. Further, for the interval t10, a through current is generated from the power source $V_{DD}$ shown in FIG. 9 via the PMOS transistor 7, PMOS transistor 40 and pull-down resistor 26a. However, the through current can be made infinitesimal by making the resistance value of the pull-down resistor 26a sufficiently greater than the ON-resistance of the PMOS transistor 7.

As described above, in contrast to the prior art in which the read data bus RDB is driven by the CMOS inverter shown in FIG. 27, the present preferred embodiment has the construction as follows. That is, the driver capacity of the read data bus RDB is reduced by driving it by means of the PMOS transistor 7, and the delay time of the read signal on the read data bus RDB is remarkably reduced by not effecting the full swing of the level of the read data bus RDB from the H level to the L level or from the L level to the H level. With this arrangement, the data read operation speed can be increased without any erroneous read, and the charge and discharge currents of the read data bus RDB can be reduced further than those of the prior art, thereby allowing the consumption power to be remarkably reduced.

Third Preferred Embodiment

Figure 12:
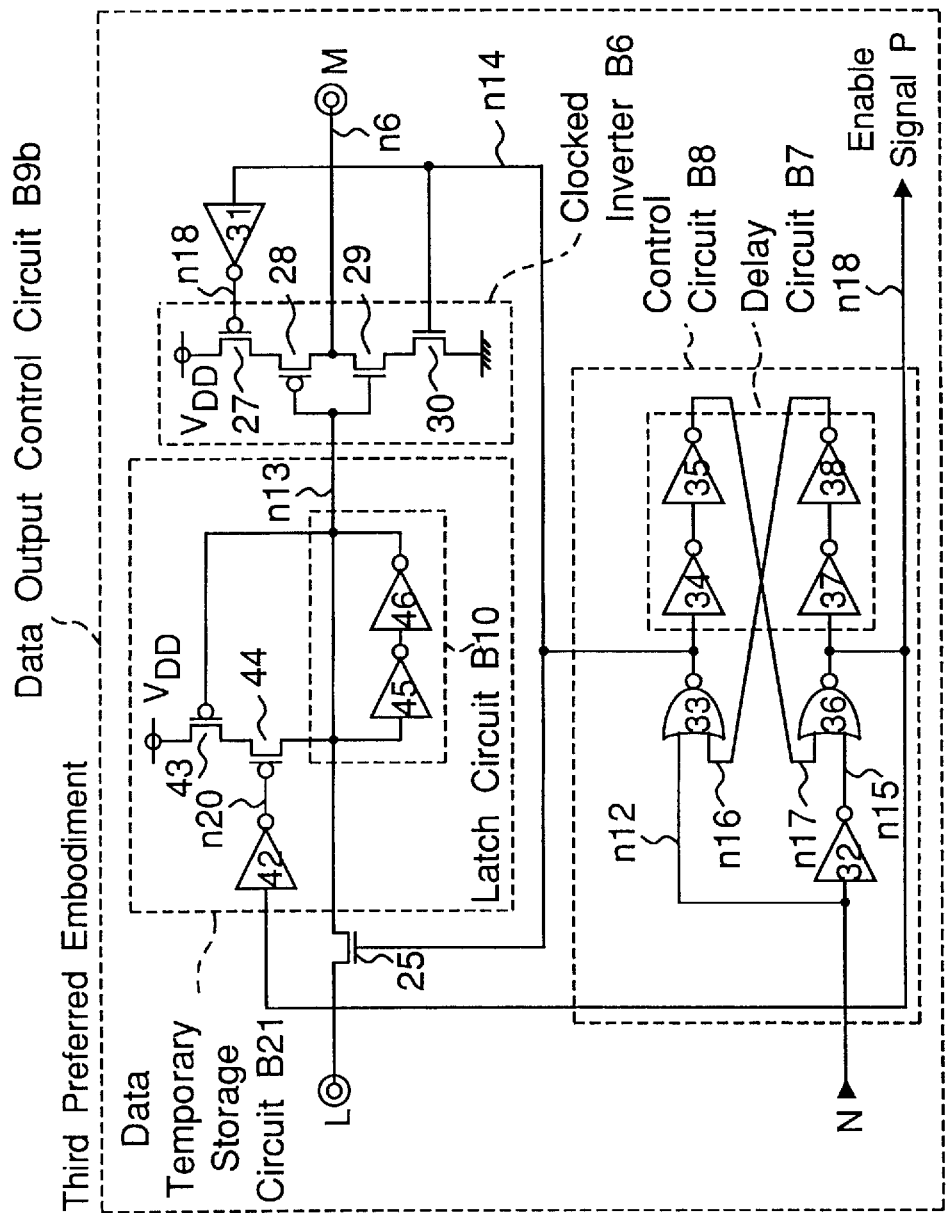
FIG. 12 is a block diagram of a data output control circuit B9b of an SRAM data read circuit according to a third preferred embodiment of the present invention.
Figure 13:
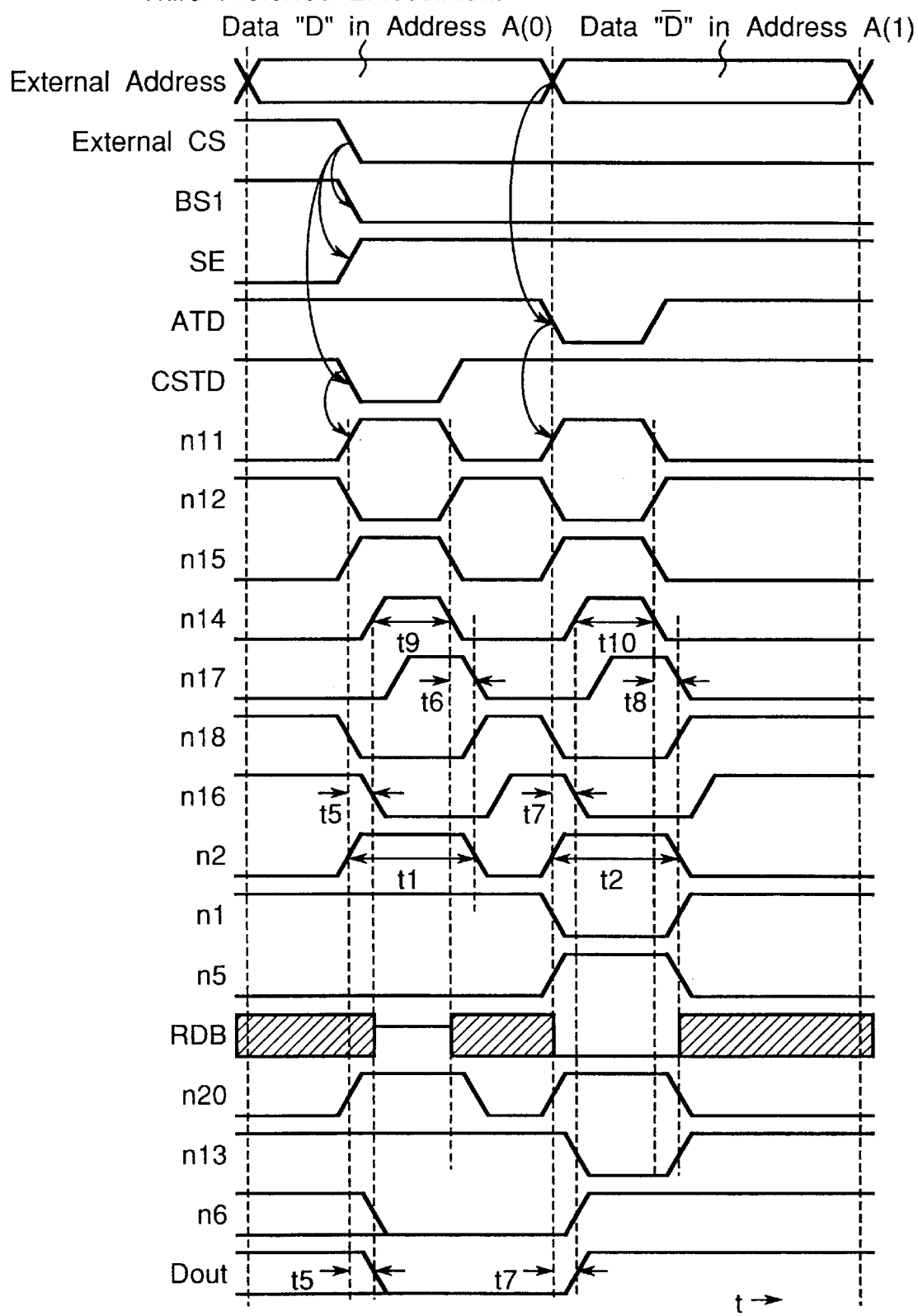
FIG. 13 is a timing chart showing an operation of the SRAM data read circuit of the third preferred embodiment.

FIG. 12 is a block diagram of a data output control circuit B9b of an SRAM data read circuit according to a third preferred embodiment of the present invention. FIG. 13 is a timing chart showing an operation of the SRAM data read circuit of the third preferred embodiment. The data output control circuit B9b of the present preferred embodiment is characterized in comprising a data temporary storage circuit B21 in place of the pull-up resistor 26.

In FIG. 12, the control circuit B8 is a circuit which is constructed in a manner similar to that of the first preferred embodiment and operates to control the operations of the clocked inverter B6 and the NMOS transistor 25 and control the turning-on and -off of the sense amplifier 1 and a PMOS transistor 44 by the enable signal P. In this case, the enable signal P is applied via an inverter 42 and a node n20 to the gate of a PMOS transistor 44, and the power source $V_{DD}$ is connected via the source and the drain of a PMOS transistor 43 and the source and the drain of the PMOS transistor 44 to the node n13. It is to be noted that the signal at the node n13 is applied to the gate of the PMOS transistor 43.

In this case, when the sense amplifier 1 is activated, the PMOS transistor 44 is turned off and the clocked inverter B6 is activated, thereby turning on the NMOS transistor 25. When the sense amplifier 1 is deactivated, the PMOS transistor 44 is turned on and the clocked inverter B6 is deactivated, thereby turning off the NMOS transistor 25. A latch circuit B10 is comprised of inverters 45 and 46 which are connected in series in a loop form and in which an input terminal of the inverter 45 and an output terminal of the inverter 46 are connected to the node n13. The latch circuit B10 temporarily stores an H-level signal that is outputted via the PMOS transistors 43 and 44 to the node n13 or temporarily stores an L-level signal that is outputted via the NMOS transistor 25 to the node n13.

The timing chart of FIG. 13 shows an operation of reading data in two cycles with external addresses of an address A(0) and an address A(1) for the reading of data from the address A(0) and the address A(1), and it is assumed that data different from each other have been preparatorily written in the address A(0) and the address A(1) (e.g., when the data stored in the address A(0) is "0", the data stored in the address A(1) is "1"). It is further assumed that the data stored in the address A(0) and the data stored in the address A(1) are each outputted from B1(1) shown in FIG. 4. It is further assumed that the input signal G is fixed to the H level and the input signal K is fixed to the L level in FIG. 5.

A read operation of the third preferred embodiment will be described with reference to FIG. 13.

When the external CS signal comes to have the L level upon reading the data stored in the address A(0), the BS1 signal comes to have the L level, and the memory block of the read signal generator circuit B1(1) is selected to be activated. An SE signal for selecting between writing and reading comes to have the H level, and the data of the memory block of the read signal generator circuit B1(1) is permitted to be read. Further, in response to a trailing edge of the external CS signal, a CSTD signal that is a negative pulse signal is generated, and the CSTD signal is applied via the NAND gate 22 to the node n11. A positive pulse signal is generated at the node n11, and the positive pulse signal is applied via the NAND gate 21 to the node n12. A negative pulse signal is generated at the node n12, and the negative pulse signal is applied via the inverter 32 to the node n15, so that a positive pulse signal is generated at the node n15.

The negative pulse signal at the node n12 and the positive pulse signal at the node n15 operate in the control circuit B8 in a manner similar to that of the first preferred embodiment, as a consequence of which a positive pulse is outputted to the node n14, and a negative pulse signal is outputted to the node n18. The negative pulse signal at the node n18 activates the sense amplifier 1 for an interval t1 in a manner similar to that of the first preferred embodiment, an H-level signal is outputted as the data stored in the address A(0) to the node n1, and the output state to the read data bus RDB comes to have a high impedance. The level at the node n13 comes to have the H level by the latch circuit B10 immediately before the sense amplifier 1 is activated as described in detail later. Consequently, the NMOS transistor 25 is turned on for the interval t9 for which a positive pulse signal is generated at the node n14, and the clocked inverter B6 is activated. By this operation, an L-level signal is outputted to the node n6, the L-level signal is temporarily stored in the data latch circuit B2, and the L-level signal is outputted to the external output terminal Dout. It is to be noted that a level signal that is lower than the H level by the threshold value Vth of the NMOS transistor 25 is outputted to the read data bus RDB for the interval t9. However, the level signal has no direct relation with the data output to the external output terminal Dout, and the level of the read data bus RDB is undefined for an interval other than the interval t9 and the interval t2 as described later.

The negative pulse signal at the node n18 is applied via the inverter 41 to the node n20, a positive pulse signal is generated at the node n20, and the PMOS transistor 44 is turned off in the positive pulse interval of the node n20. Upon reading the data stored in the address A(0), the node n13 remains at the H level, and therefore, the PMOS transistor 43 remains off, and no influence is exerted on the node n13 whether the PMOS transistor 44 is turned on or off.

Upon reading the data stored in the address A(1), the sense amplifier 1 is activated for the interval t2 in a manner similar to that of the first preferred embodiment, the NMOS transistor 8 is turned on, and an L-level signal is outputted to the read data bus RDB. The PMOS transistor 44 is turned off simultaneously with the activation of the sense amplifier 1, and a positive pulse signal is generated at the node n14 for the interval t10 that is included in the center portion of the interval t2 and is shorter than the interval t2, as a consequence of which the NMOS transistor 25 is turned on and the clocked inverter B6 is activated. In this stage, the node n13 that has come to have the H level by the latch circuit B10 comes to have the L level as a consequence of the rewriting in the latch circuit B10. The L-level signal is applied via the clocked inverter B6 to the node n6, and an H-level signal is outputted to the node n6. The H-level signal is temporarily stored in the data latch circuit B2, and an H-level signal is outputted to the external output terminal Dout. Immediately after the interval t10, the NMOS transistor 25 is turned off, and the clocked inverter B6 is deactivated. At this point of time, the node n13 is kept at the L level by the latch circuit B10. However, immediately after the interval t2, the node n20 comes to have the L level, and the PMOS transistor 44 is turned on. In this stage, the node n13 is at the L level and the PMOS transistor 43 is turned on. Therefore, an H-level signal is outputted via the PMOS transistors 43 and 44 to the node n13, and the signal level held in the latch circuit B10 is rewritten into the H level, as a consequence of which the node n13 is kept at the H level, and the PMOS transistor 43 is turned off.

Therefore, the control circuit B8 executes control so that an H-level signal is stored in the data temporary storage circuit B21 for an interval other than the interval t1 or the interval t2 which is the reading stage of data from the memory cell and in which the sense amplifier 1 is activated. The control circuit B8 also executes the control so that the NMOS transistor 25 and the clocked inverter B6 are turned on for the predetermined interval t9 that is included for the interval t1 and is shorter than the interval t1 and for the interval t10 that is included for the interval t2 and is shorter than the interval t2. When the NMOS transistor 8 is turned on, the L-level signal outputted from the NMOS transistor 8 is outputted to the data output circuit B4 via the NMOS transistor 25, data temporary storage circuit B21 and clocked inverter B6. When the NMOS transistor 8 is turned off, the H-level signal temporarily stored in the data temporary storage circuit B21 is outputted via the clocked inverter B6 to the data output circuit B4.

Thus, the control circuit B8 generates a positive pulse signal at the node n14 for the interval t9 that is included for the interval t1 and is shorter than the interval t1 and for the interval t10 that is included for the interval t2 and is shorter than the interval t2, for each of these intervals the a positive pulse signal is generated at the node n2 and the sense amplifier 1 is activated. By this operation, in addition to the control so that the NMOS transistor 25 is turned on and the clocked inverter B6 is activated, the PMOS transistor 44 is made to be not turned on for the interval for which the NMOS transistor 25 is turned on and the clocked inverter B6 is activated, thereby playing the role of preventing the erroneous read of data in another address in the next cycle.

As described above, the third preferred embodiment has the same effect as that of the first preferred embodiment, however, the through current that is generated from the power source $V_{DD}$ via the pull-up resistor 26, NMOS transistor 25 and NMOS transistor 8 for the interval t10 of the first preferred embodiment can be eliminated, and therefore, the consumption power can be further reduced than that of the first preferred embodiment.

Fourth Preferred Embodiment

Figure 14:
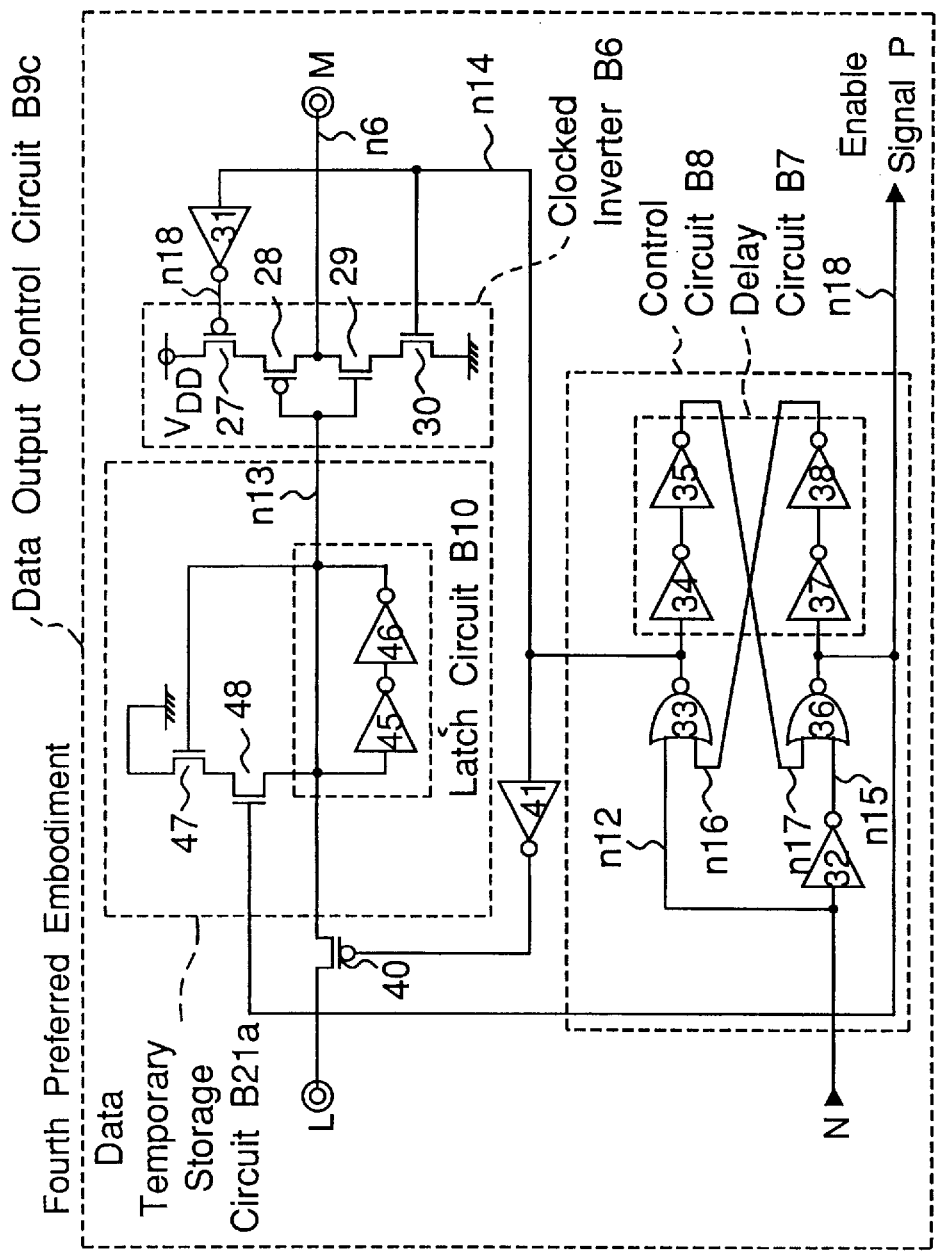
FIG. 14 is a block diagram of a data output control circuit B9c of an SRAM data read circuit according to a fourth preferred embodiment of the present invention.
Figure 15:
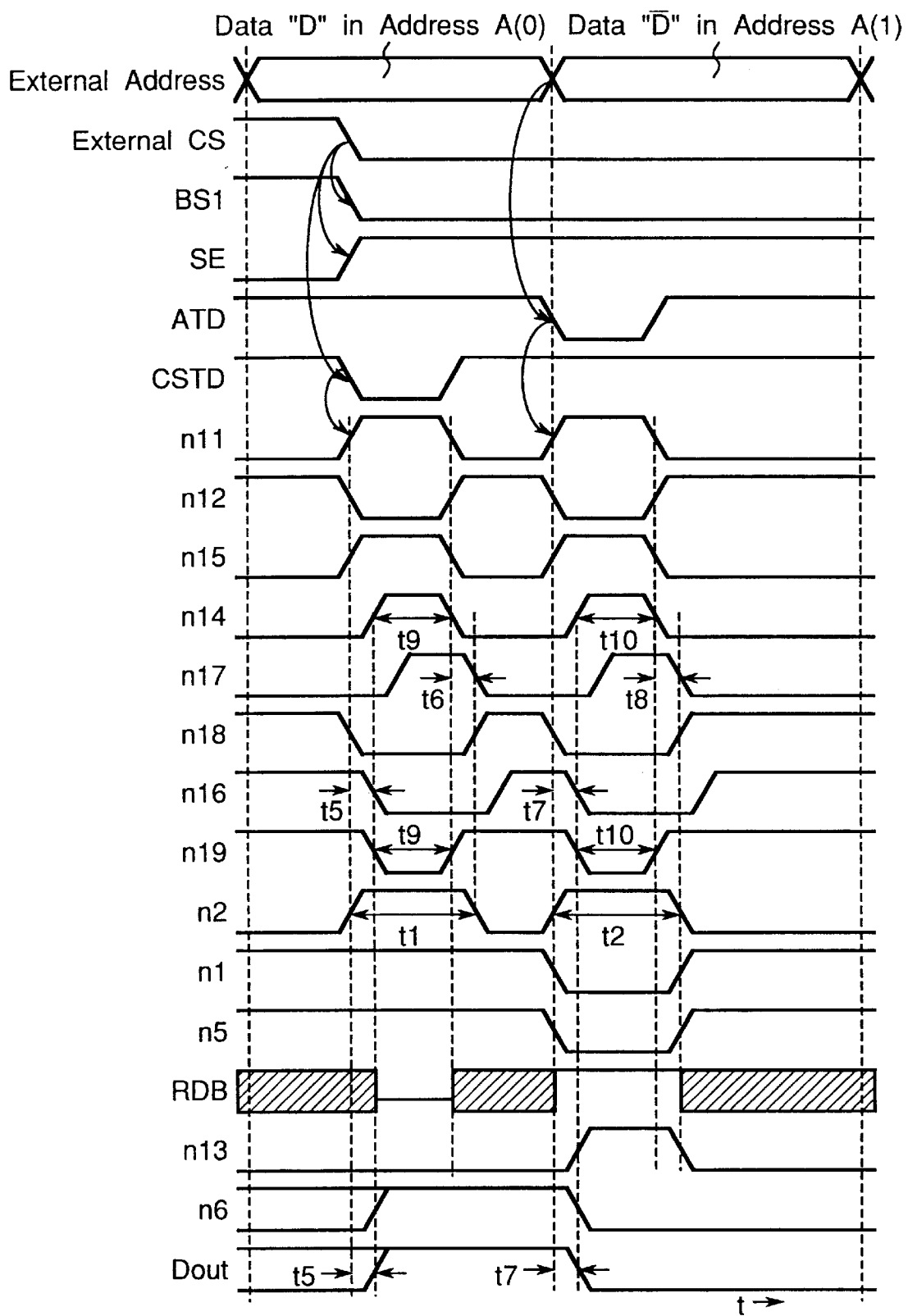
FIG. 15 is a timing chart showing an operation of the SRAM data read circuit of the fourth preferred embodiment.

FIG. 14 is a block diagram of a data output control circuit B9c of an SRAM data read circuit according to a fourth preferred embodiment of the present invention, and FIG. 15 is a timing chart showing an operation of the SRAM data read circuit of the fourth preferred embodiment. The data output control circuit B9c of the present preferred embodiment is characterized in comprising a data temporary storage circuit B21a in place of the pull-up resistor 26 in comparison with the data output control circuit B9 shown in FIG. 5.

In FIG. 14, the control circuit B8 is a circuit which is constructed in a manner similar to that of the first preferred embodiment and operates to control the operations of the clocked inverter B6 and the NMOS transistor 25 and control the turning-on and -off of the sense amplifier 1 and an NMOS transistor 48 by the enable signal P. In this case, the enable signal P is applied to the gate of the NMOS transistor 48 and the node n13 is grounded via the drain and the source of the NMOS transistor 48 and the drain and the source of an NMOS transistor 47. It is to be noted that the signal at the node n13 is applied to the gate of the NMOS transistor 47.

In this case, when the sense amplifier 1 is activated and the PMOS transistor 48 is turned off and the clocked inverter B6 is activated, so that the PMOS transistor 40 is turned on. When the sense amplifier 1 is deactivated, the NMOS transistor 48 is turned on and the clocked inverter B6 is deactivated, so that the PMOS transistor 40 is turned off. The latch circuit B10 is constructed in a manner similar to that of the third preferred embodiment and operates to temporarily store an L-level signal that is outputted via the NMOS transistors 47 and 48 to the node n13 or temporarily store an H-level signal that is outputted via the PMOS transistor 40 to the node n13.

The timing chart of FIG. 15 shows an operation of reading data in two cycles with external addresses of an address A(0) and an address A(1) for the reading of data from the address A(0) and the address A(1), and it is assumed that data different from each other have been preparatorily written in the address A(0) and the address A(1) (e.g., when the data stored in the address A(0) is "0", the data stored in the address A(1) is "1"). It is further assumed that the data stored in the address A(0) and the data stored in the address A(1) are each outputted from the read signal generator circuit B1(1) shown in FIG. 4. It is further assumed that the input signal G is fixed to the H level and the input signal K is fixed to the L level in FIG. 5.

A read operation of the fourth preferred embodiment will be described below with reference to FIG. 15.

When the external CS signal comes to have the L level upon reading the data stored in the address A(0), the BS1 signal comes to have the L level, and the memory block of the read signal generator circuit B1(1) is selected to be activated. An SE signal for selecting between writing and reading comes to have the H level, and the data stored in the memory block of the read signal generator circuit B1(1) is permitted to be read. Further, in response to a trailing edge of the external CS signal, a CSTD signal that is a negative pulse signal is generated, and the CSTD signal is applied via the NAND gate 22 to the node n11. A positive pulse signal is generated at the node n11, and the positive pulse signal is applied via the NAND gate 21 to the node n12. A negative pulse signal is generated at the node n12, and the negative pulse signal is applied via the inverter 32 to the node n15, so that a positive pulse signal is generated at the node n15.

The negative pulse signal at the node n12 and the positive pulse signal at the node n15 operate in the control circuit B8 in a manner similar to that of the first preferred embodiment. Consequently, a positive pulse signal is outputted to the node n14, and a negative pulse signal is outputted to the node n18. The positive pulse signal at the node n14 is applied via the inverter 41 to the node n19, and a negative pulse signal is generated at the node n19.

The negative pulse signal at the node n18 activates the sense amplifier 1 for the interval t1 in a manner similar to that of the second preferred embodiment, as a consequence of which an H-level signal is outputted as data stored in the address A(0) to the node n1, and the output state to the read data bus RDB comes to have a high impedance. The level at the node n13 is kept at the L level by the latch circuit B10 immediately before the sense amplifier 1 is activated as described in detail later. The PMOS transistor 40 is turned on and the clocked inverter B6 is activated for the interval t9 for which a negative pulse signal is generated at the node n19. Consequently, an H-level signal is outputted to the node n6, the L-level signal is temporarily stored in the data latch circuit B2, and an L-level signal is outputted to the external output terminal Dout.

It is to be noted that a level signal that is higher than the L level by the threshold value Vth of the PMOS transistor 40 is outputted to the read data bus RDB for the interval t9. However, the level signal has no direct relation with the data output to the external output terminal Dout, and the level of the read data bus RDB is undefined for an interval other than the interval t9 and the interval t2 as described later. Further, the negative pulse signal at the node n18 turns off the NMOS transistor 48 for the negative pulse interval of the node n18. Upon reading the data stored in the address A(0), the node n13 remains at the H level, and therefore, the NMOS transistor 47 remains off, and no influence is exerted on the node n13 whether the NMOS transistor 48 is turned on or off.

Upon reading the data stored in the address A(1), the sense amplifier 1 is activated for the interval t2 in a manner similar to that of the second preferred embodiment, and the PMOS transistor 7 is turned on, so that an H-level signal is outputted to the read data bus RDB. The NMOS transistor 48 is turned off simultaneously with the activation of the sense amplifier 1, and a positive pulse signal is generated at the node n14 for the interval t10 that is included in the center portion of the interval t2 and is shorter than the interval t2, as a consequence of which the PMOS transistor 40 is turned on and the clocked inverter B6 is activated. The node n13 that has come to have the L level by the latch circuit B10 comes to have the H level as a consequence of the rewriting in the latch circuit B10. The H-level signal is applied via the clocked inverter B6 to the node n6, and an L-level signal is outputted to the node n6. The L-level signal is temporarily stored in the data latch circuit B2, and an L-level signal is outputted to the external output terminal Dout. Immediately after the interval t10, the PMOS transistor 40 is turned off, and the clocked inverter B6 is deactivated. At this point of time, the node n13 is kept at the H level by the latch circuit B10. However, immediately after the interval t2, the node n14 comes to have the H level, and the NMOS transistor 48 is turned on. In this stage, the node n13 is at the H level and the NMOS transistor 47 is turned on. Therefore, the L-level signal is outputted via the NMOS transistors 47 and 48 to the node n13, and the signal level held in the latch circuit B10 is rewritten into the L level, as a consequence of which the node n13 is kept at the L level, and the NMOS transistor 47 is turned off.

Therefore, the control circuit B8 executes control so that the L-level signal is preparatorily stored in the data temporary storage circuit B21a for an interval other than the interval t1 or the interval t2 which is the reading stage of data from the memory cell and in which the sense amplifier 1 is activated. The control circuit B8 also executes control so that the PMOS transistor 40 and the clocked inverter B6 are turned on for the predetermined interval t9 that is included for the interval t1 and is shorter than the interval t1 and for the interval t10 that is included for the interval t2 and shorter than the interval t2. When the PMOS transistor 7 is turned on, the H-level signal outputted from the PMOS transistor 7 is outputted to the data output circuit B4 via the PMOS transistor 40, data temporary storage circuit B21a and clocked inverter B6. When the PMOS transistor 7 is turned off, the L-level signal temporarily stored in the data temporary storage circuit B21a is outputted via the clocked inverter B6 to the data output circuit B4.

Thus, the control circuit B8 executes the control so that it generates a positive pulse signal at the node n14 for the interval t9 that is included in the center portion of the interval t1 and is shorter than the interval t1 and for the interval t10 that is included in the center portion of the interval t2 and is shorter than the interval t2, for each of these intervals a positive pulse signal is generated at the node n2 and the sense amplifier 1 is activated, thereby turning on the PMOS transistor 40 and activating the clocked inverter B6. In addition to this, for the interval for which the PMOS transistor 40 is turned on and the clocked inverter B6 is activated, the NMOS transistor 48 is prevented from being turned on, thereby playing the role of preventing the erroneous read of data in another address in the next cycle.

As described above, the fourth preferred embodiment has the same effect as that of the second preferred embodiment. However, the through current that flows from the power source $V_{DD}$ via the PMOS transistor 7, PMOS transistor 40 and pull-up resistor 26 to the grounding terminal for the interval t10 of the second preferred embodiment can be eliminated, and therefore, the consumption power can be further reduced than that of the second preferred embodiment.

Fifth Preferred Embodiment

Figure 16:
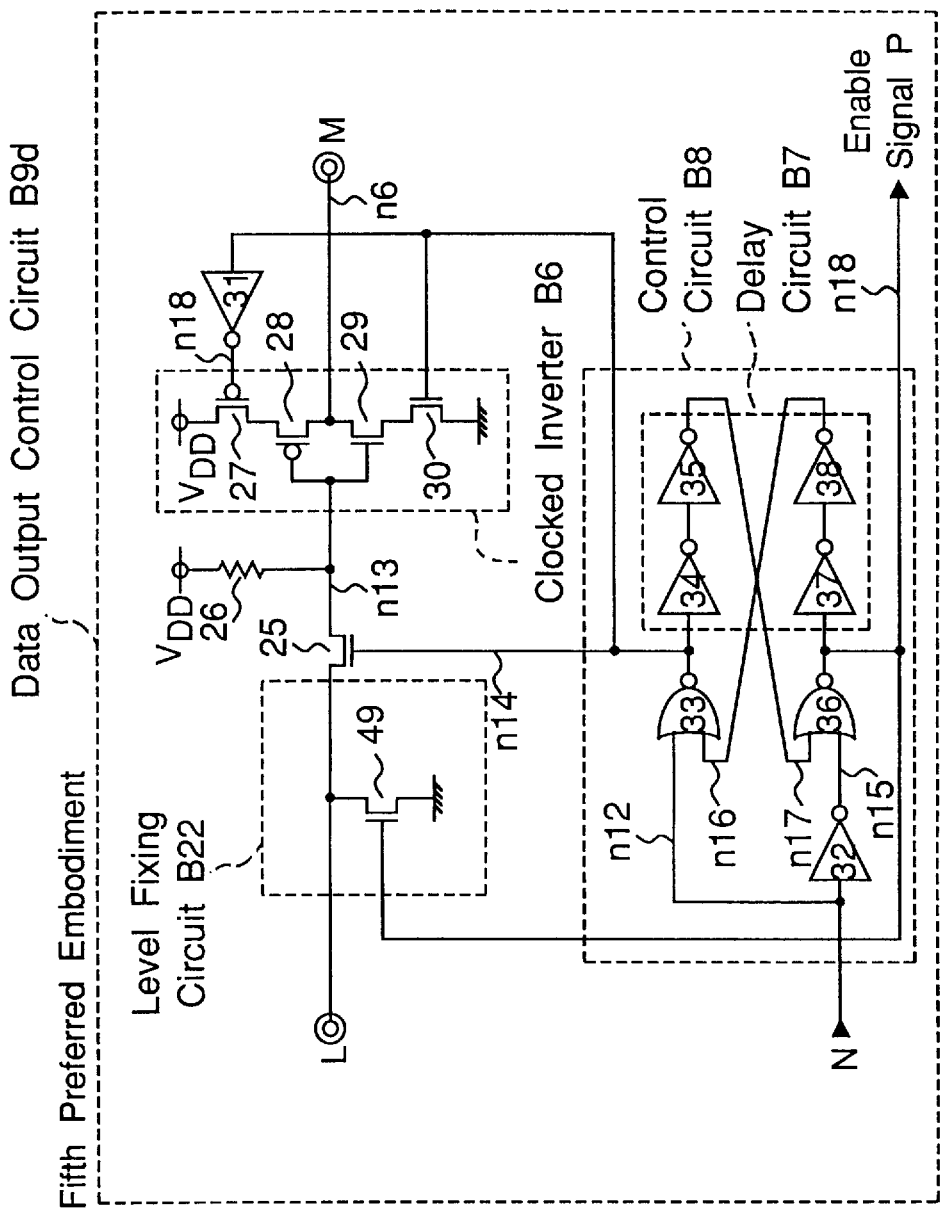
FIG. 16 is a block diagram of a data output control circuit B9d of an SRAM data read circuit according to a fifth preferred embodiment of the present invention.
Figure 17:
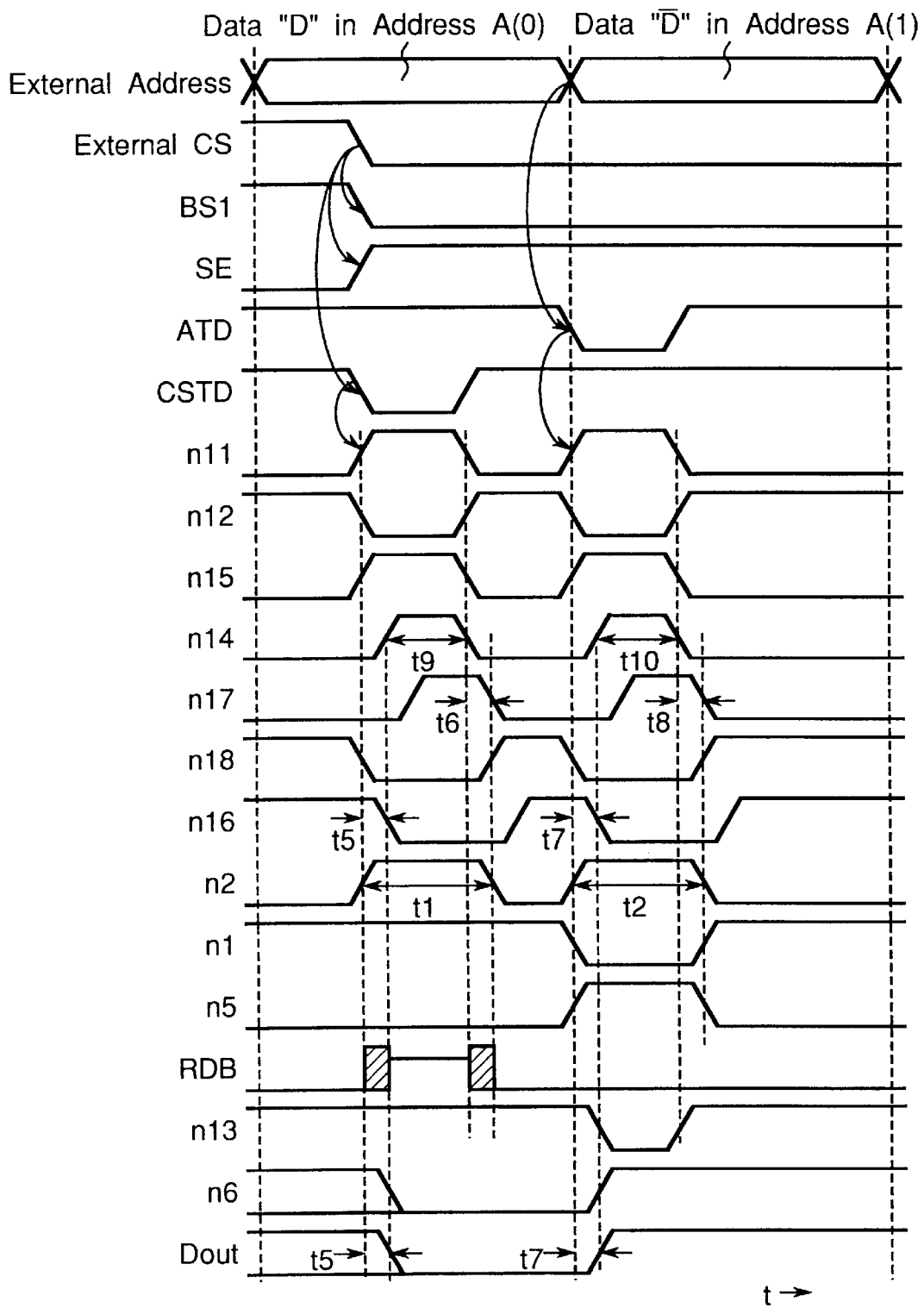
FIG. 17 is a timing chart showing an operation of the SRAM data read circuit of the fifth preferred embodiment.

FIG. 16 is a block diagram of a data output control circuit B9d of an SRAM data read circuit according to a fifth preferred embodiment of the present invention, and FIG. 17 is a timing chart showing an operation of the SRAM data read circuit of the fifth preferred embodiment. The data output control circuit B9d of the present preferred embodiment is characterized in further comprising a level fixing circuit B22 as shown in FIG. 16 in comparison with the data output control circuit B9 shown in FIG. 7.

In FIG. 16, the control circuit B8 is a circuit which is constructed in a manner similar to that of the first preferred embodiment and operates to control the operations of the clocked inverter B6 and the NMOS transistor 25 and control the turning-on and -off of the sense amplifier 1 and an NMOS transistor 49 by the enable signal P. The level fixing circuit B22 is provided with the NMOS transistor 49, and the input terminal L is grounded via the drain and the source of the NMOS transistor 49. The enable signal from the control circuit B8 is applied to the gate of the NMOS transistor 49. In this case, when the sense amplifier 1 is activated, the NMOS transistor 49 is turned off and the clocked inverter B6 is activated, so that the NMOS transistor 25 is turned on. When the sense amplifier 1 is deactivated, the NMOS transistor 49 is turned on and the clocked inverter B6 is deactivated, so that the NMOS transistor 25 is turned off.

The timing chart of FIG. 17 shows an operation of reading data in two cycles with external addresses of an address A(0) and an address A(1) for the reading of data from the address A(0) and the address A(1), and it is assumed that data different from each other have been preparatorily written in the address A(0) and the address A(1) (e.g., when the data stored in the address A(0) is "0", the data stored in the address A(1) is "1"). It is further assumed that the data stored in the address A(0) and the data stored in the address A(1) are each outputted from the read signal generator circuit B1(1) shown in FIG. 4. It is further assumed that the input signal G is fixed to the H level and the input signal K is fixed to the L level in FIG. 5.

A read operation of the fifth preferred embodiment will be described with reference to FIG. 17.

In either case of reading data stored in the address A(0) and reading data stored in the address A(1), respective data are outputted to the external output terminal Dout in a manner similar to that of the first preferred embodiment. What is different from the first preferred embodiment is the level of the read data bus RDB. The level of the read data bus RDB is fixed to the L level since the NMOS transistor 49 is turned on for the interval other than the intervals t1 and t2 for which the sense amplifier 1 is deactivated. However, for the interval t1, there is the same state as that of the first preferred embodiment. However, since intervals t5 and t6 are sufficiently shorter than the interval t1, the intervals t5 and t6 can be substantially regarded as the L level. Further, the NMOS transistor 49 is turned off for the interval t2, however, since the NMOS transistor 8 is turned on, the level of the read data bus RDB is fixed to the L level.

As described above, the fifth preferred embodiment has the same effect as that of the first preferred embodiment. Furthermore, by fixing the level of the read data bus RDB to the L level when the sense amplifier 1 is deactivated, a delay time that is generated for the driving of the read data bus RDB to the L level when the sense amplifier 1 is activated as well as the undefined level interval of the read data bus RDB are eliminated. Therefore, a data read operation that is more stable than that of the first preferred embodiment can be achieved, and the speed of the data read operation can be increased.

Sixth Preferred Embodiment

Figure 18:
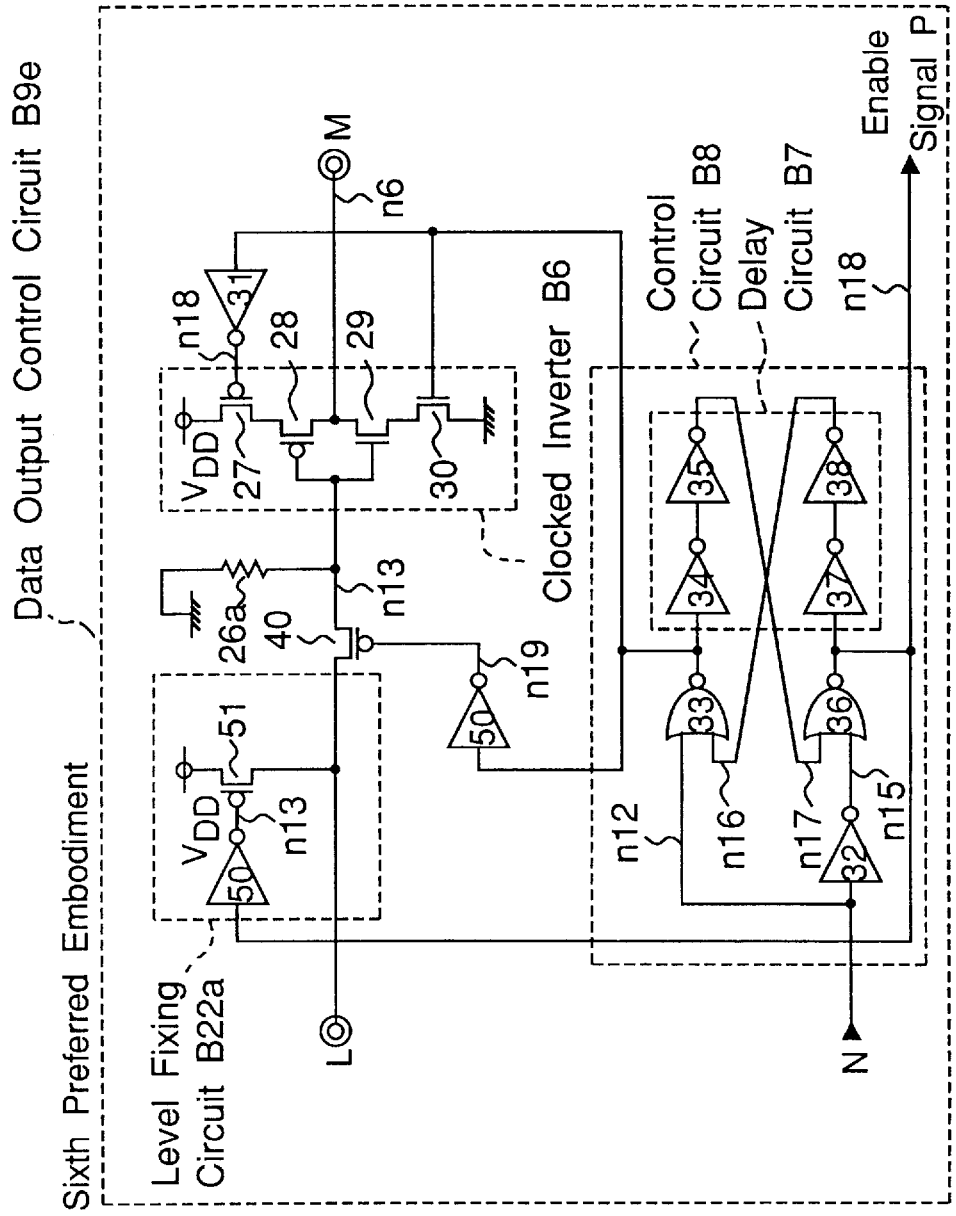
FIG. 18 is a block diagram of a data output control circuit B9e of an SRAM data read circuit according to a sixth preferred embodiment of the present invention.
Figure 19:
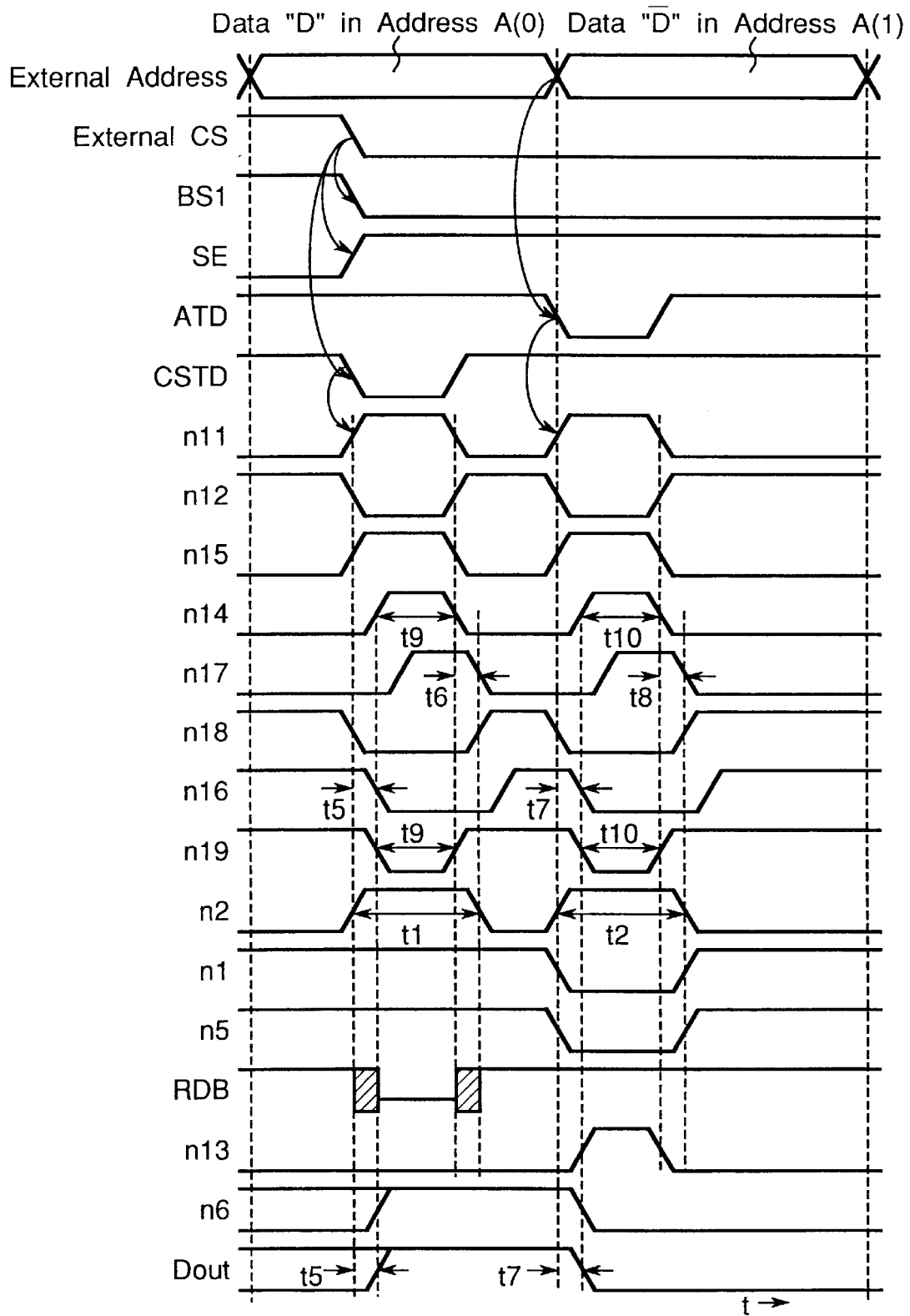
FIG. 19 is a timing chart showing an operation of the SRAM data read circuit of the sixth preferred embodiment.

FIG. 18 is a block diagram of a data output control circuit B9e of an SRAM data read circuit according to a sixth preferred embodiment of the present invention, and FIG. 19 is a timing chart showing an operation of the SRAM data read circuit of the sixth preferred embodiment. The data output control circuit B9e of the present preferred embodiment is characterized in further comprising a level fixing circuit B22a in comparison with the data output control circuit B9a of the second preferred embodiment shown in FIG. 8.

In FIG. 18, the control circuit B8 is a circuit which is constructed in a manner similar to that of the first preferred embodiment and operates to control the operations of the clocked inverter B6 and the PMOS transistor 40 and control the turning-on and -off of the sense amplifier 1 and a PMOS transistor 51 by the enable signal P. The level fixing circuit B22a is comprised of an inverter 50 and the PMOS transistor 51, where the power source $V_{DD}$ is connected via the source and the drain of the PMOS transistor 51 to the input terminal L, and the enable signal P from the control circuit B8 is applied via the inverter 50 to the gate of the PMOS transistor 51. In this case, when the sense amplifier 1 is activated, the PMOS transistor 51 is turned off and the clocked inverter B6 is activated, so that the PMOS transistor 40 is turned on. When the sense amplifier 1 is deactivated, the PMOS transistor 51 is turned on and the clocked inverter B6 is deactivated, so that the PMOS transistor 40 is turned off.

The timing chart of FIG. 19 shows an operation of reading data in two cycles with external addresses of an address A(0) and an address A(1) for the reading of data from the address A(0) and the address A(1), and it is assumed that data different from each other have been preparatorily written in the address A(0) and the address A(1) (e.g., when the data stored in the address A(0) is "0", the data stored in the address A(1) is "1"). It is further assumed that the data stored in the address A(0) and the data stored in the address A(1) are each outputted from the read signal generator circuit B1(1) shown in FIG. 4. It is further assumed that the input signal G is fixed to the H level and the input signal K is fixed to the L level in FIG. 5.

A read operation of the sixth preferred embodiment will be described with reference to FIG. 19.

In either case of reading data stored in the address A(0) and reading data stored in the address A(1), respective data are outputted to the external output terminal Dout in a manner similar to that of the second preferred embodiment. What is different from the second preferred embodiment is the level of the read data bus RDB. The level of the read data bus RDB is fixed to the H level since the PMOS transistor 51 is turned on for the interval other than the intervals t1 and t2 for which the sense amplifier 1 is deactivated. For the interval t1, there is the same state as that of the second preferred embodiment. However, since intervals t5 and t6 are sufficiently shorter than the interval t1, the intervals t5 and t6 can be substantially regarded as the H level. Further, the PMOS transistor 51 is turned off for the interval t2, however, since the PMOS transistor 7 is turned on, the level of the read data bus RDB is fixed to the H level.

As described above, the sixth preferred embodiment has the same effect as that of the second preferred embodiment. Furthermore, by fixing the level of the read data bus RDB to the H level when the sense amplifier 1 is deactivated, a delay time that is generated for the driving of the read data bus RDB to the H level when the sense amplifier 1 is activated as well as the undefined level interval of the read data bus RDB are eliminated. Therefore, a data read operation that is more stable than that of the second preferred embodiment can be achieved, and the speed of the data read operation can be increased.

Seventh Preferred Embodiment

Figure 20:
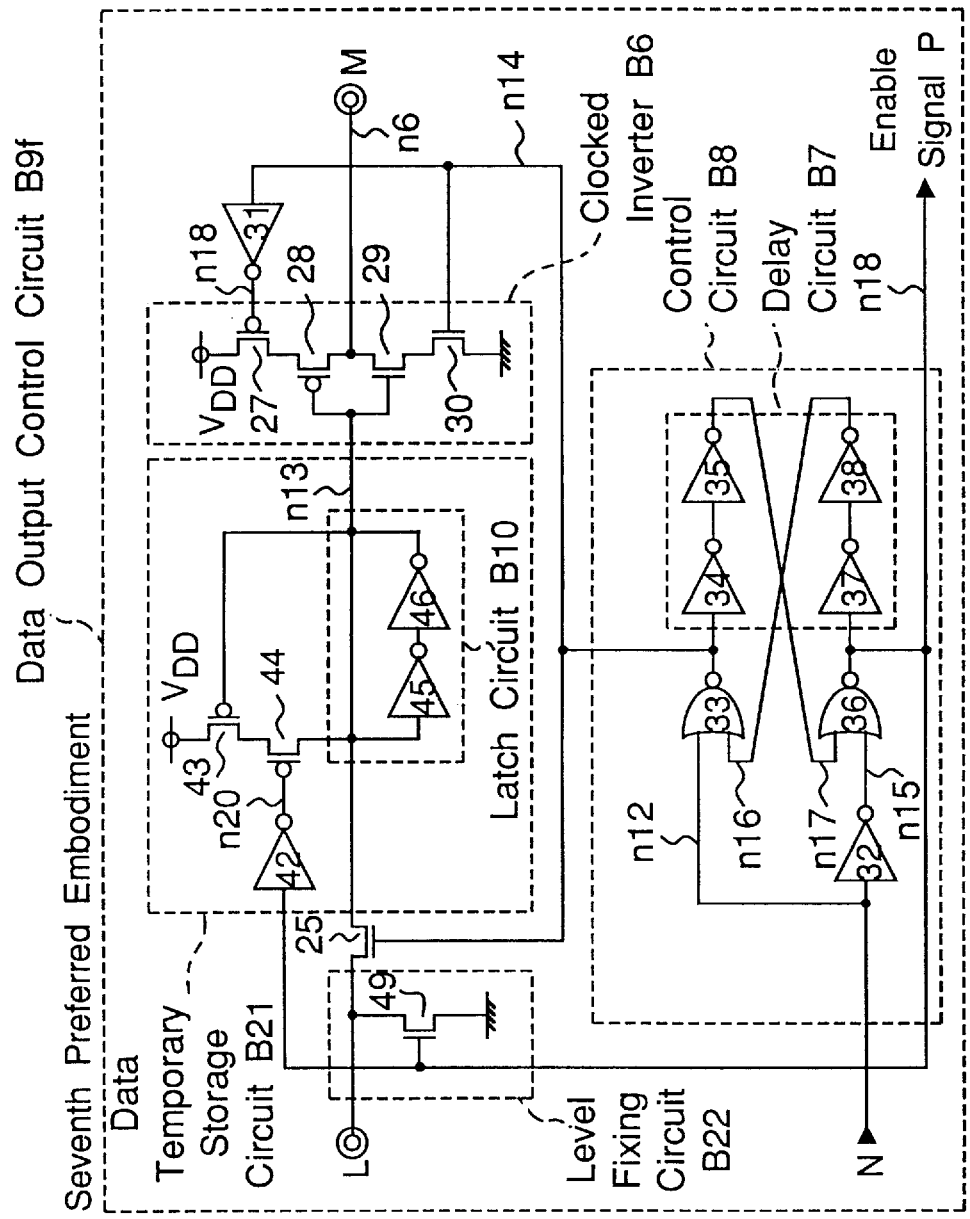
FIG. 20 is a block diagram of a data output control circuit B9f of an SRAM data read circuit according to a seventh preferred embodiment of the present invention.
Figure 21:
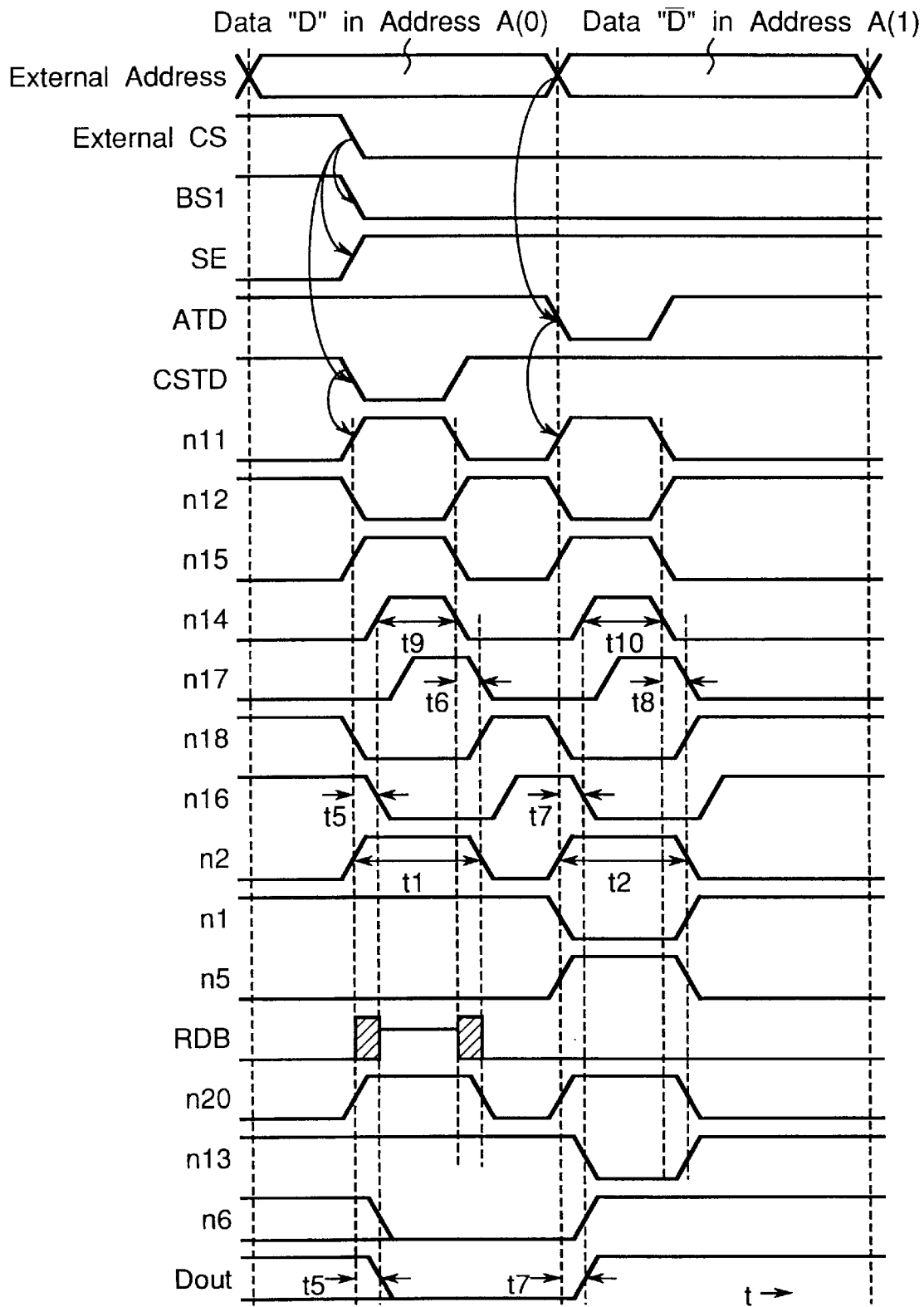
FIG. 21 is a timing chart showing an operation of the SRAM data read circuit of the seventh preferred embodiment.

FIG. 20 is a block diagram of a data output control circuit B9f of an SRAM data read circuit according to a seventh preferred embodiment of the present invention, and FIG. 21 is a timing chart showing an operation of the SRAM data read circuit of the seventh preferred embodiment. The data output control circuit B9f of the present preferred embodiment is characterized in comprising both of the data temporary storage circuit B21 of the third preferred embodiment shown in FIG. 12 and the level fixing circuit B22 of the fifth preferred embodiment shown in FIG. 16.

The timing chart of FIG. 21 shows an operation of reading data in two cycles with external addresses of an address A(0) and an address A(1) for the reading of data from the address A(0) and the address A(1), and it is assumed that data different from each other have been preparatorily written in the address A(0) and the address A(1) (e.g., when the data stored in the address A(0) is "0", the data stored in the address A(1) is "1"). It is further assumed that the data stored in the address A(0) and the data stored in the address A(1) are each outputted from the read signal generator circuit B1(1) shown in FIG. 4. It is further assumed that the input signal G is fixed to the H level and the input signal K is fixed to the L level in FIG. 5.

A read operation of the seventh preferred embodiment will be described with reference to FIG. 21.

In either case of reading data stored in the address A(0) and reading data stored in the address A(1), respective data are outputted to the external output terminal Dout in a manner similar to that of the third preferred embodiment. What is different from the third preferred embodiment is the level of the read data bus RDB. The level of the read data bus RDB is fixed to the L level since the NMOS transistor 49 is turned on for the interval other than the intervals t1 and t2 for which the sense amplifier 1 is deactivated. For the interval t1, there is the same state as that of the first preferred embodiment. However, since intervals t5 and t6 are suffi-ciently shorter than the interval t1, the intervals t5 and t6 can be substantially regarded as the L level. Further, the NMOS transistor 49 is turned off for the interval t2, however, since the NMOS transistor 8 is turned on, the level of the read data bus RDB is fixed to the L level.

As described above, the fifth preferred embodiment has the same effect as that of the third preferred embodiment. Furthermore, by fixing the level of the read data bus RDB to the L level when the sense amplifier 1 is deactivated, a delay time that is generated for the driving of the read data bus RDB to the L level when the sense amplifier 1 is activated as well as the undefined level interval of the read data bus RDB are eliminated. Therefore, a data read operation that is more stable than those of the first and third preferred embodiments can be achieved, and the speed of the data read operation can be increased.

Eighth Preferred Embodiment

Figure 22:
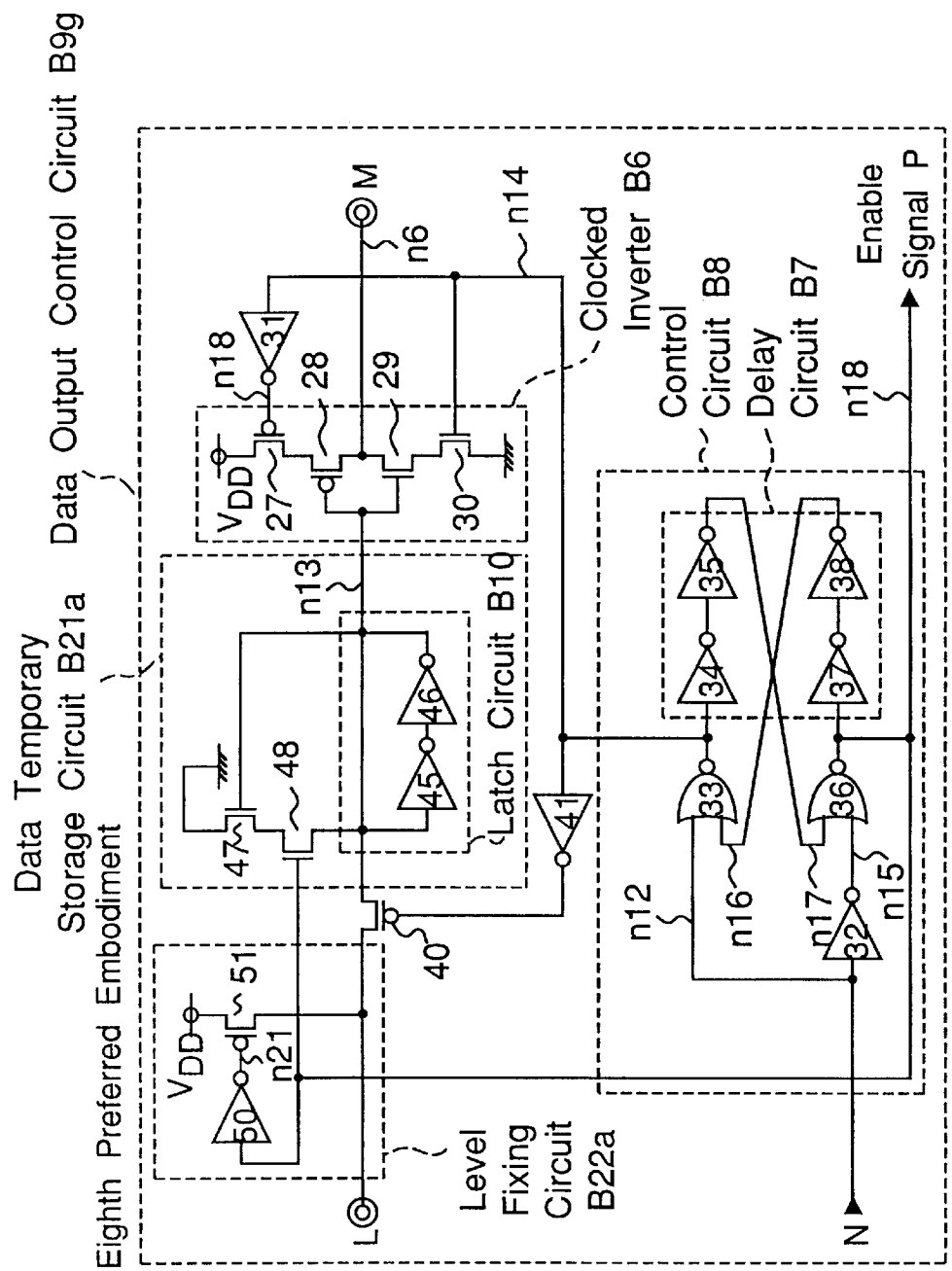
FIG. 22 is a block diagram of a data output control circuit B9g of an SRAM data read circuit according to an eighth preferred embodiment of the present invention.
Figure 23:
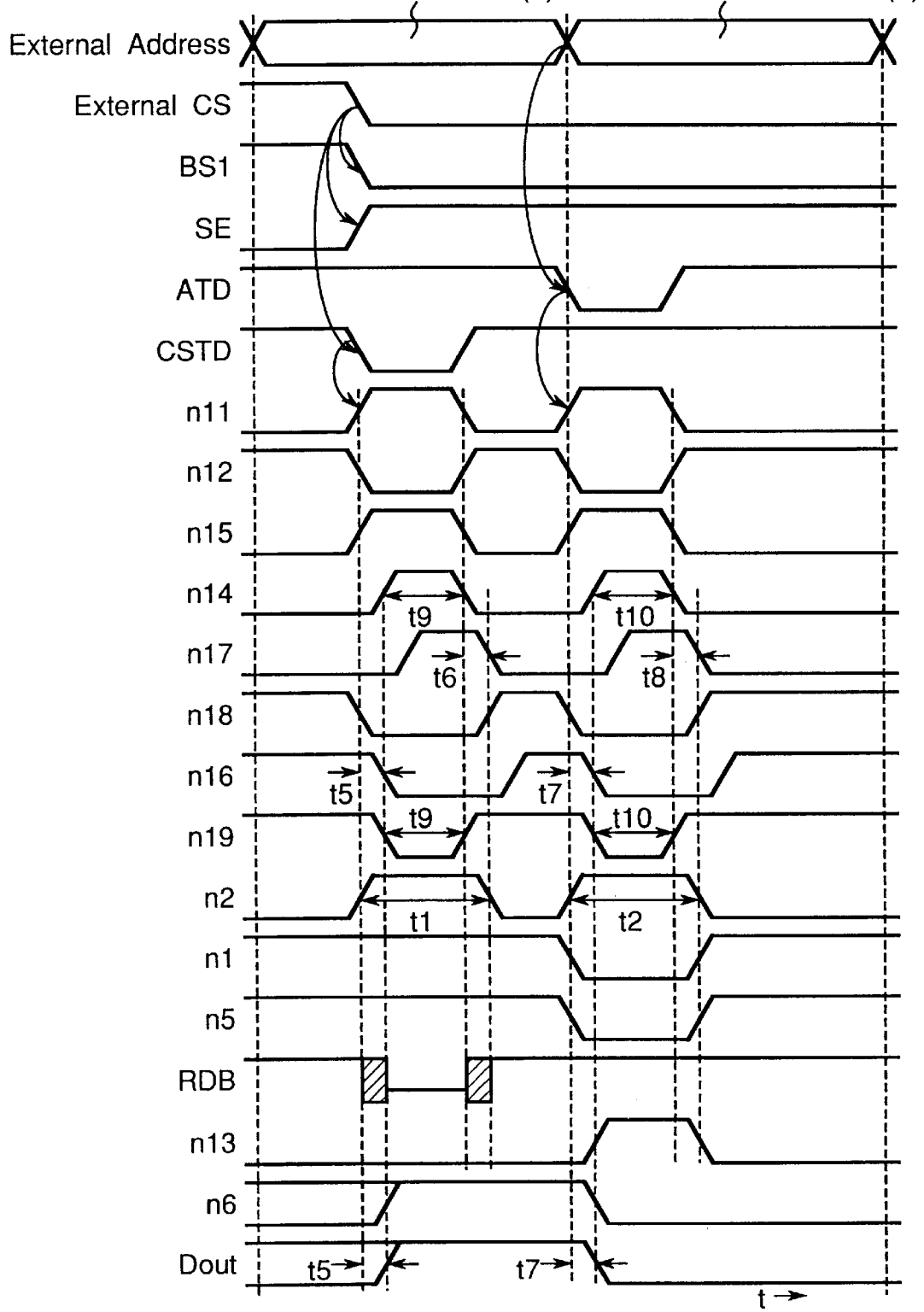
FIG. 23 is a timing chart showing an operation of the SRAM data read circuit of the eighth preferred embodiment.

FIG. 22 is a block diagram of a data output control circuit B9g of an SRAM data read circuit according to an eighth preferred embodiment of the present invention, and FIG. 23 is a timing chart showing an operation of the SRAM data read circuit of the eighth preferred embodiment. The data output control circuit B9g of the present preferred embodiment is provided with both of the data temporary storage circuit B21a of the fourth preferred embodiment shown in FIG. 14 and the level fixing circuit B22a of the sixth preferred embodiment shown in FIG. 18.

The timing chart of FIG. 23 shows an operation of reading data in two cycles with external addresses of an address A(0) and an address A(1) for the reading of data from the address A(0) and the address A(1), and it is assumed that data different from each other have been preparatorily written in the address A(0) and the address A(1) (e.g., when the data stored in the address A(0) is "0", the data stored in the address A(1) is "1"). It is further assumed that the data stored in the address A(0) and the data stored in the address A(1) are each outputted from the read signal generator circuit B1(1) shown in FIG. 4. It is further assumed that the input signal G is fixed to the H level and the input signal K is fixed to the L level in FIG. 5.

A read operation of the eighth preferred embodiment will be described with reference to FIG. 23.

In either case of reading data stored in the address A(0) and reading data stored in the address A(1), respective data are outputted to the external output terminal Dout in a manner similar to that of the fourth preferred embodiment. What is different from the fourth preferred embodiment is the level of the read data bus RDB. The level of the read data bus RDB is fixed to the H level since the PMOS transistor 51 is turned on for the interval other than the intervals t1 and t2 for which the sense amplifier 1 is deactivated. For the interval t1, there is the same state as that of the second preferred embodiment. However, since intervals t5 and t6 are sufficiently shorter than the interval t1, the intervals t5 and t6 can be substantially regarded as the H level. Further, the PMOS transistor 51 is turned off for the interval t2, however, since the PMOS transistor 7 is turned on, the level of the read data bus RDB is fixed to the H level.

As described above, the eighth preferred embodiment has the same effect as that of the fourth preferred embodiment. Furthermore, by fixing the level of the read data bus RDB to the H level when the sense amplifier 1 is deactivated, a delay time that is generated for the driving of the read data bus RDB to the H level when the sense amplifier 1 is activated as well as the undefined level interval of the read data bus RDB are eliminated. Therefore, a data read operation that is more stable than those of the second and fourth preferred embodiments can be achieved, and the speed of the data read operation can be increased.

Ninth Preferred Embodiment

Figure 24:
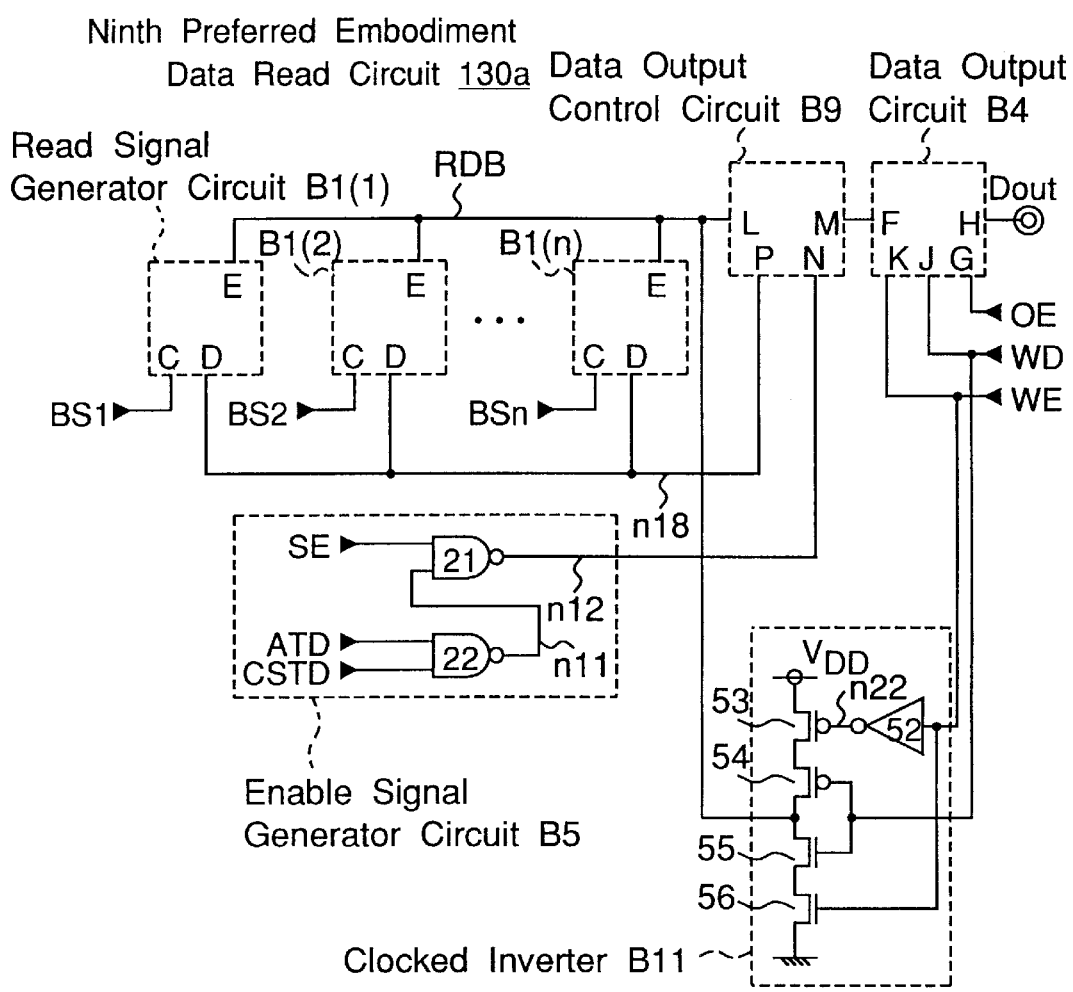
FIG. 24 is a block diagram of an SRAM data read circuit according to a ninth preferred embodiment of the present invention.
Figure 25:
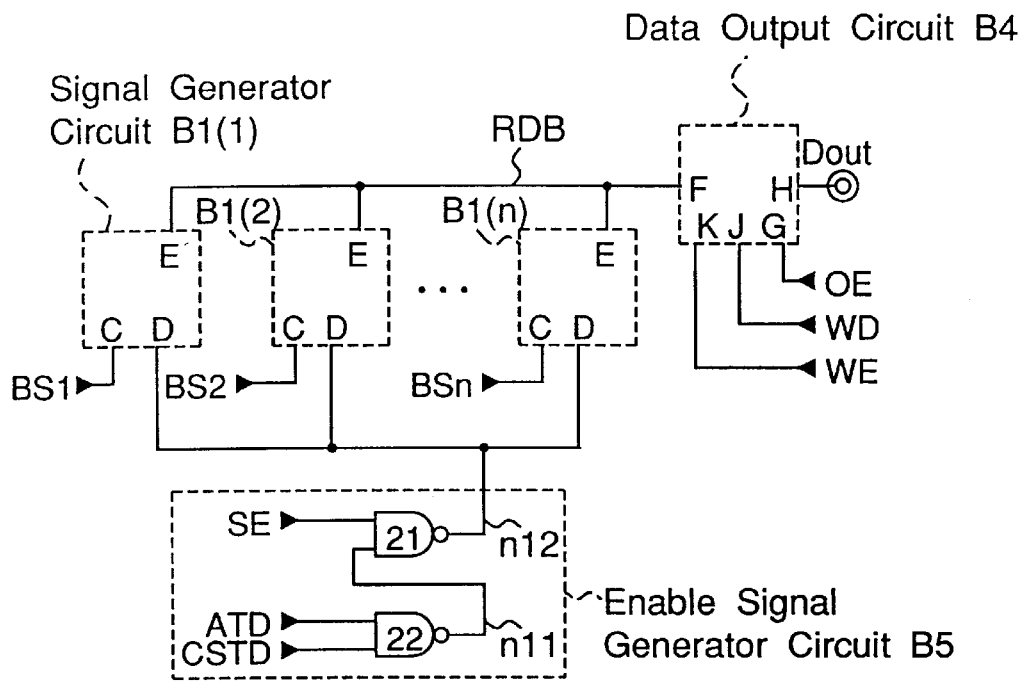
FIG. 25 is a block diagram of a prior art SRAM data read circuit.

FIG. 24 is a block diagram of an SRAM data read circuit according to a ninth preferred embodiment of the present invention. As shown in FIG. 24, the present preferred embodiment is provided with a clocked inverter B11 which can be applied to the first preferred embodiment, the second preferred embodiment, the third preferred embodiment and the fourth preferred embodiment, and of which read data bus RDB is used commonly as a write data bus.

The clocked inverter B11 is comprised of an inverter 52, PMOS transistors 53 and 54 and NMOS transistors 55 and 56. The WE signal comes to have the H level in the write operation, when the clocked inverter B11 is activated and the WD signal is inverted and outputted to the read data bus RDB, thereby transferring the writing data to each memory block of the memory cell array. In the clocked inverter B11, the WE signal comes to have the L level in the read operation, when the clocked inverter B11 is deactivated and the output state to the read data bus RDB comes to have a high impedance. Therefore, the read data bus RDB can be commonly used as the write data bus.

As described above, according to the present preferred embodiment, the read data bus RDB and the write data bus can be commonly used, so that the layout area can be reduced substantially to a half in comparison with the prior art in which the read data bus RDB and the write data bus are separated.

Modified Preferred Embodiment

Figure 29:
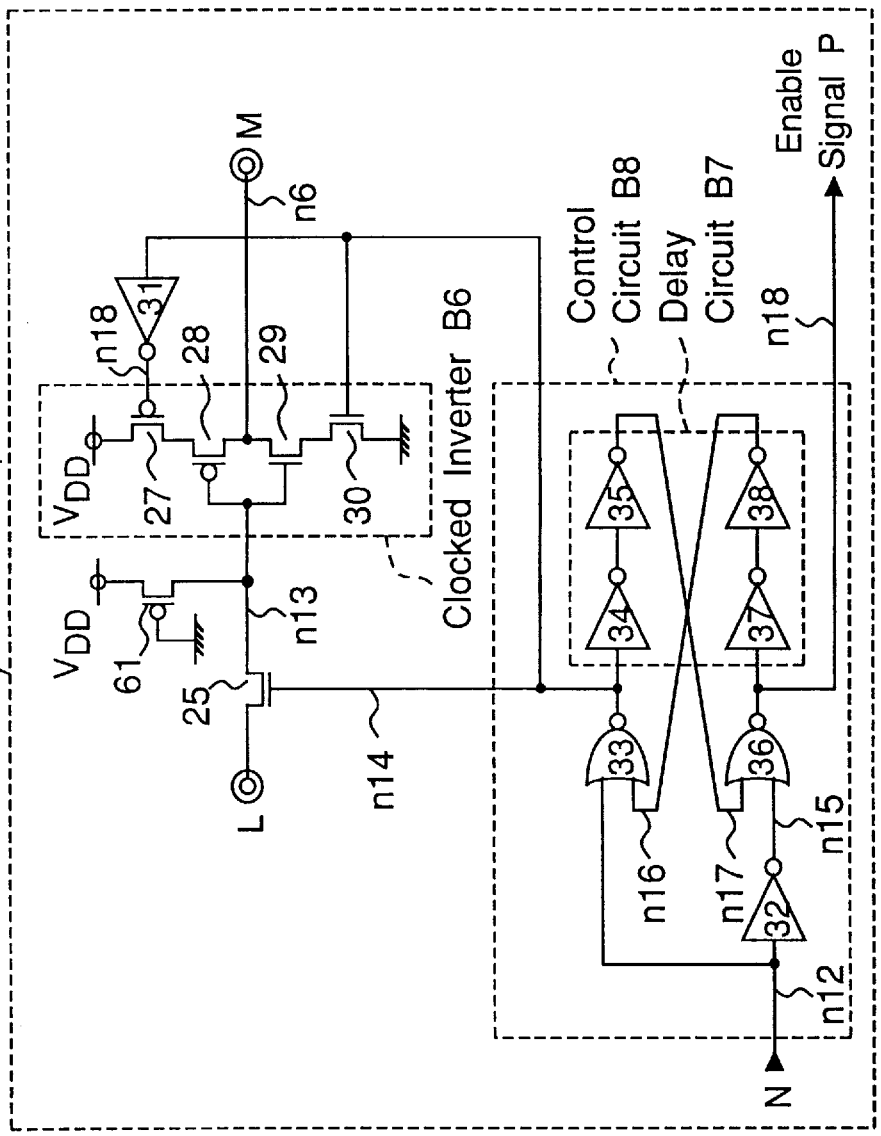
FIG. 29 is a block diagram of a data output control circuit B9h according to a modified preferred embodiment of the first preferred embodiment.

FIG. 29 is a block diagram of a data output control circuit B9h according to a modified preferred embodiment of the first preferred embodiment. As shown in FIG. 29, a pull-up resistor provided with a PMOS transistor 61 may be used in place of the pull-up resistor 26 of the first preferred embodiment shown in FIG. 7. The power source $V_{DD}$ is connected to the node n13 via the source and the drain of the PMOS transistor 61 of which gate is grounded. In this case, the occupation area of the PMOS transistor 61 on the substrate is smaller than that of the pull-up resistor 26 comprised of the resistor element, and therefore, the area of the entire circuit can be reduced. This modified preferred embodiment can be also applied to the fifth preferred embodiment shown in FIG. 16.

Figure 30:
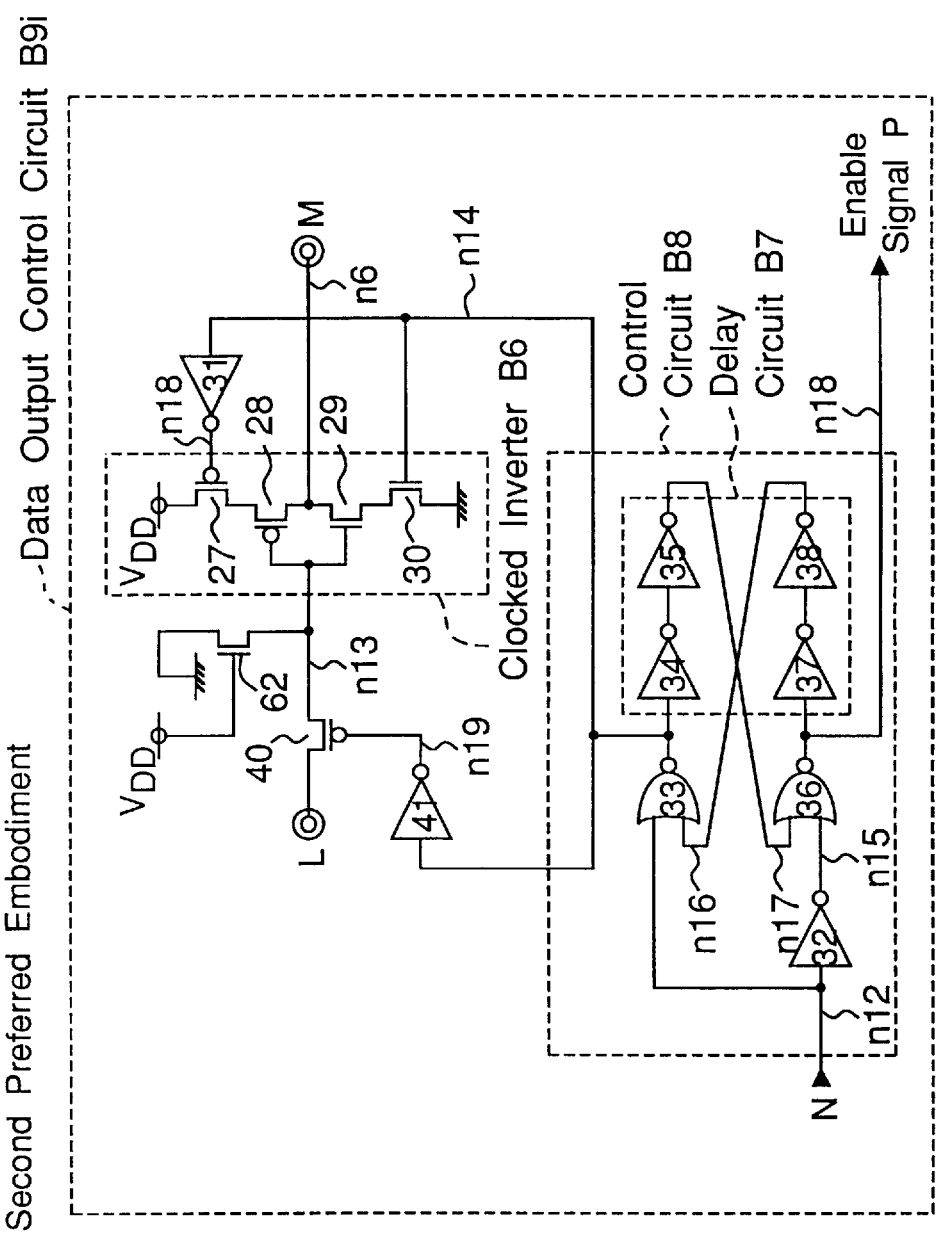
FIG. 30 is a block diagram of a data output control circuit B9i according to a modified preferred embodiment of the second preferred embodiment.

FIG. 30 is a block diagram of a data output control circuit B9i according to a modified preferred embodiment of the second preferred embodiment. As shown in FIG. 30, a pull-down resistor provided with an NMOS transistor 62 may be used in place of the pull-down resistor 26a of the second preferred embodiment shown in FIG. 10. The power source $V_{DD}$ having the H level is connected to the gate of the NMOS transistor 62, and the node n13 is grounded via the drain and the source of the NMOS transistor 62. In this case, the occupation area of the NMOS transistor 62 on the substrate is smaller than the pull-down resistor 26a comprised of the resistor element, and therefore, the area of the entire circuit can be reduced. This modified preferred embodiment can be also applied to the sixth preferred embodiment shown in FIG. 18.

In the above-mentioned preferred embodiments, the positive pulse signal may be an H-level pulse signal, and the negative pulse signal may be an L-level pulse signal.

In the above-mentioned preferred embodiments, the SRAM is described. However, the present invention is not limited to this, and the present invention can be widely applied to a semiconductor storage apparatus of a CMOS memory such as a DRAM or the like other than the SRAM, as well as a semiconductor storage apparatus of a CMOS memory having a heavily loaded bus of which junction capacity component is greater than its wiring capacity.

In the above-mentioned preferred embodiments, the driver capacity of the read data bus RDB can be reduced, and this allows the delay time of the read signal on the read data bus RDB to be significantly reduced, allows the data read operation speed to be increased without any erroneous read, allows the charge and discharge currents of the read data bus RDB to be reduced further than those of the prior art, and allows the consumption power to be remarkably reduced.

In the above-mentioned preferred embodiments, the above-mentioned temporary storage circuit is further provided, then the through current flowing through the read data bus RDB can be eliminated, and the consumption power can be further reduced.

In the above-mentioned preferred embodiments, the above-mentioned level fixing circuit is further provided, then the delay time generated due to the driving of the read data bus RDB to the H level when the sense amplifier is activated as well as the undefined level interval of the read data bus RDB are eliminated. Therefore, a more stable read operation can be achieved, and the data read operation speed can be increased.

In the above-mentioned preferred embodiments, the occupation area of the PMOS transistor on the substrate is smaller than that of the pull-up resistor comprised of the resistor element, and accordingly, the area of the entire circuit can be reduced.

In the above-mentioned preferred embodiments, the read data bus RDB and the write data bus can be commonly used, and this allows the layout area to be reduced substantially to a half in comparison with the prior art in which the read data bus RDB and the write data bus are separated.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A data read circuit for use in a semiconductor storage apparatus of a CMOS memory, wherein a memory cell array of said semiconductor storage apparatus is divided into a plurality of memory blocks, wherein each of said memory blocks comprises a sense amplifier for amplifying a data output signal from a memory cell, wherein a read signal from said sense amplifier of said memory block selected by a block select signal obtained by decoding an external address is transmitted via a read data bus to a data output circuit having a data latch circuit, said data read circuit comprising:

an NMOS transistor for being turned on and off in response to a read signal from said sense amplifier in a data reading stage when said sense amplifier is activated, said NMOS transistor disposed on each of said memory blocks, said NMOS transistor having a drain connected to said read data bus and a grounded source, wherein a first level signal is outputted to said read data bus by turning on said NMOS transistor when the read signal from said sense amplifier has a first level, while the read signal from said sense amplifier is stopped from being outputted to said read data bus by turning off said NMOS transistor when the read signal from said sense amplifier has a second level; and a data output control circuit connected between said read data bus and said data output circuit for generating an output enable signal to control said sense amplifier.

2. The data read circuit as claimed in claim 1, said data output control circuit further comprising:

a pull-up resistor for pulling up a signal line between said read data bus and said data output circuit to the first level;

a first switching circuit connected so as to be inserted between said read data bus and said signal line;

a second switching circuit for inverting an inputted signal and outputting an inverted signal, said second switching circuit connected so as to be inserted between said signal line and said data output circuit; and a control circuit for controlling said first and second switching circuits to turn on said first and second switching circuits for a predetermined second interval which is included in a first interval for which said sense amplifier is activated in a stage of reading data from said memory cell, said second interval being shorter than said first interval, wherein a second level signal outputted from said NMOS transistor is outputted to said data output circuit via said first and second switching circuits when said NMOS transistor is turned on for the second interval, while the first level signal on said signal line pulled up by said pull-up resistor is outputted to said data output circuit via said second switching circuit when said NMOS transistor is turned off.

3. The data read circuit as claimed in claim 1, said data output control circuit further comprising:

a temporary storage circuit for temporarily storing a level signal therein, said temporary storage circuit connected so as to be inserted between said read data bus and said data output circuit;

a first switching circuit connected so as to be inserted between said read data bus and said temporary storage circuit;

a second switching circuit for inverting an inputted signal and outputting an inverted signal, said second switching circuit connected so as to be inserted between said temporary storage circuit and said data output circuit; and a control circuit for controlling said temporary storage circuit to preparatorily store a first level signal into said temporary storage circuit for an interval other than a first interval for which said sense amplifier is activated in a stage of reading data from said memory cell, and for controlling said first and second switching circuits to turn on said first and second switching circuits for a predetermined second interval which is included in said first interval and is shorter than said first interval, wherein a second level signal outputted from said NMOS transistor is outputted to said data output circuit via said first switching circuit, said temporary storage circuit and said second switching circuit when said NMOS transistor is turned on in said second interval, while the first level signal stored temporarily in said temporary storage circuit is outputted to said data output circuit via said second switching circuit when said NMOS transistor is turned off.

4. The data read circuit as claimed in claim 2, said data output control circuit further comprising:

a level fixing circuit for fixing said read data bus to the second level for an interval other than said first interval, said level fixing circuit connected so as to be inserted between said read data bus and said first switching circuit.

5. The data read circuit as claimed in claim 3, said data output control circuit further comprising:

a level fixing circuit for fixing said read data bus to the second level for an interval other than said first interval, said level fixing circuit connected so as to be inserted between said read data bus and said first switching circuit.

6. The data read circuit as claimed in claim 2, wherein said pull-up resistor comprises a PMOS transistor having a gate to which the second level signal is applied.

7. The data read circuit as claimed in claim 1, further comprising:

an inverter circuit for making an output terminal connected to said read data bus a high impedance in the stage of reading data from said memory cell, and for inverting a write data signal and transmitting an inverted write data signal via said read data bus to each of said memory blocks for an interval other than the stage of reading data from said memory cell, wherein said read data bus is commonly used as a write data bus.

8. The data read circuit as claimed in claim 2, further comprising:

an inverter circuit for making an output terminal connected to said read data bus a high impedance in the stage of reading data from said memory cell, and for inverting a write data signal and transmitting an inverted write data signal via said read data bus to each of said memory blocks for an interval other than the stage of reading data from said memory cell, wherein said read data bus is commonly used as a write data bus.

9. A data read circuit for use in a semiconductor storage apparatus of a CMOS memory, wherein a memory cell array of said semiconductor storage apparatus is divided into a plurality of memory blocks, wherein each of said memory blocks comprises a sense amplifier for amplifying a data output signal from a memory cell, wherein a read signal from said sense amplifier of said memory block selected by a block select signal obtained by decoding an external address is transmitted via a read data bus to a data output circuit having a data latch circuit, said data read circuit comprising:

a PMOS transistor for being turned on and off in response to a read signal from said sense amplifier in a data reading stage when said sense amplifier is activated, said PMOS transistor disposed on each of said memory blocks, said PMOS transistor having a drain connected to said read data bus and a source connected to a power source, wherein a first level signal is outputted to said read data bus by turning on said PMOS transistor when the read signal from said sense amplifier has a first level, while the read signal from said sense amplifier is stopped from being outputted to said read data bus by turning off said PMOS transistor when the read signal from said sense amplifier has a second level; and a data output control circuit connected between said read data bus and said data output circuit for generating an output enable signal to control said sense amplifier.

10. The data read circuit as claimed in claim 9, said data output control circuit further comprising:

a pull-down resistor for pulling down a signal line between said read data bus and said data output circuit to the second level;

a first switching circuit connected so as to be inserted between said read data bus and said signal line;

a second switching circuit for inverting an inputted signal and outputting an inverted signal, said second switching circuit connected so as to be inserted between said signal line and said data output circuit and operates; and a control circuit for controlling said first and second switching circuits to turn on said first and second switching circuits for a predetermined second interval which is included in a first interval for which said sense amplifier is activated in a stage of reading data from said memory cell, said second interval being shorter than said first interval, wherein a first level signal outputted from said PMOS transistor is outputted to said data output circuit via said first and second switching circuits when said PMOS transistor is turned on in said second interval, while the second level signal on said signal line pulled down by said pull-down resistor is outputted to said data output circuit via said second switching circuit when said PMOS transistor is turned off.

11. The data read circuit as claimed in claim 9, said data output control circuit further comprising:

a temporary storage circuit for temporarily storing a level signal therein, said temporary storage circuit connected so as to be inserted between said read data bus and said data output circuit;

a first switching circuit connected so as to be inserted between said read data bus and said temporary storage circuit;

a second switching circuit for inverting an inputted signal and outputting an inverted signal, said second switching circuit connected so as to be inserted between said temporary storage circuit and said data output circuit; and a control circuit for controlling said temporary storage circuit to preparatorily store a second level signal into said temporary storage circuit for an interval other than a first interval for which said sense amplifier is activated in a stage of reading data from said memory cell, and for controlling said first and second switching circuits to turn on said first and second switching circuits for a predetermined second interval which is included in said first interval and is shorter than said first interval, wherein said first level signal outputted from said PMOS transistor is outputted to said data output circuit via said first switching circuit, said temporary storage circuit and said second switching circuit when said PMOS transistor is turned on in said second interval, while the second level signal stored temporarily in said temporary storage circuit is outputted to said data output circuit via said second switching circuit when said PMOS transistor is turned off.

12. The data read circuit as claimed in claim 10, said data output control circuit further comprising:

a level fixing circuit for fixing said read data bus to the first level for an interval other than said first interval, said level fixing circuit connected so as to be inserted between said read data bus and said first switching circuit.

13. The data read circuit as claimed in claim 11, said data output control circuit further comprising:

a level fixing circuit for fixing said read data bus to the first level for an interval other than said first interval, said level fixing circuit connected so as to be inserted between said read data bus and said first switching circuit.

14. The data read circuit as claimed in claim 10, wherein said pull-down resistor comprises an NMOS transistor having a gate to which the first level signal is applied.

15. The data read circuit as claimed in claim 9, further comprising:

an inverter circuit for making an output terminal connected to said read data bus a high impedance in the stage of reading data from said memory cell, and for inverting a write data signal and transmitting an inverted write data signal via said read data bus to each of said memory blocks for an interval other than the stage of reading data from said memory cell, wherein said read data bus is commonly used as a write data bus.

16. The data read circuit as claimed in claim 10, further comprising:

an inverter circuit for making an output terminal connected to said read data bus a high impedance in the stage of reading data from said memory cell, and for inverting a write data signal and transmitting an inverted write data signal via said read data bus to each of said memory blocks for an interval other than the stage of reading data from said memory cell, wherein said read data bus is commonly used as a write data bus.

17. A semiconductor storage apparatus of CMOS memory comprising:

a memory array having a plurality of memory cells, said plurality of memory cells divided into a plurality of memory blocks; and a data read circuit for use in said semiconductor storage apparatus, wherein a memory cell array of said semiconductor storage apparatus is divided into a plurality of memory blocks, wherein each of said memory blocks comprises a sense amplifier for amplifying a data output signal from a memory cell, wherein a read signal from said sense amplifier of said memory block selected by a block select signal obtained by decoding an external address is transmitted via a read data bus to a data output circuit having a data latch circuit, said data read circuit comprising:

an NMOS transistor for being turned on and off in response to a read signal from said sense amplifier in a data reading stage when said sense amplifier is activated, said NMOS transistor disposed on each of said memory blocks, said NMOS transistor having a drain connected to said read data bus and a grounded source, wherein a first level signal is outputted to said read data bus by turning on said NMOS transistor when the read signal from said sense amplifier has a first level, while the read signal from said sense amplifier is stopped from being outputted to said read data bus by turning off said NMOS transistor when the read signal from said sense amplifier has a second level; and a data output control circuit connected between said read data bus and said data output circuit for generating an output enable signal to control said sense amplifier.

18. The semiconductor storage apparatus as claimed in claim 17, said data output control circuit further comprising:

a pull-up resistor for pulling up a signal line between said read data bus and said data output circuit to the first level;

a first switching circuit connected so as to be inserted between said read data bus and said signal line;

a second switching circuit for inverting an inputted signal and outputting an inverted signal, said second switching circuit connected so as to be inserted between said signal line and said data output circuit; and a control circuit for controlling said first and second switching circuits to turn on said first and second switching circuits for a predetermined second interval which is included in a first interval for which said sense amplifier is activated in a stage of reading data from said memory cell, said second interval being shorter than said first interval, wherein a second level signal outputted from said NMOS transistor is outputted to said data output circuit via said first and second switching circuits when said NMOS transistor is turned on for the second interval, while the first level signal on said signal line pulled up by said pull-up resistor is outputted to said data output circuit via said second switching circuit when said NMOS transistor is turned off.

19. A semiconductor apparatus of a CMOS memory comprising:

a memory array having a plurality of memory cells, said plurality of memory cells divided into a plurality of memory blocks; and a data read circuit for use in said semiconductor storage apparatus, wherein a memory cell array of said semiconductor storage apparatus is divided into a plurality of memory blocks, wherein each of said memory blocks comprises a sense amplifier for amplifying a data output signal from a memory cell, wherein a read signal from said sense amplifier of said memory block selected by a block select signal obtained by decoding an external address is transmitted via a read data bus to a data output circuit having a data latch circuit, said data read circuit comprising:

a PMOS transistor for being turned on and off in response to a read signal from said sense amplifier in a data reading stage when said sense amplifier is activated, said PMOS transistor disposed on each of said memory blocks, said PMOS transistor having a drain connected to said read data bus and a source connected to a power source, wherein a first level signal is outputted to said read data bus by turning on said PMOS transistor when the read signal from said sense amplifier has a first level, while the read signal from said sense amplifier is stopped from being outputted to said read data bus by turning off said PMOS transistor when the read signal from said sense amplifier has a second level; and a data output control circuit connected between said read data bus and said data output circuit for generating an output enable signal to control said sense amplifier.

20. The semiconductor storage apparatus as claimed in claim 19, said data output control circuit further comprising:

a pull-down resistor for pulling down a signal line between said read data bus and said data output circuit to the second level;

a first switching circuit connected so as to be inserted between said read data bus and said signal line;

a second switching circuit for inverting an inputted signal and outputting an inverted signal, said second switching circuit connected so as to be inserted between said signal line and said data output circuit and operates; and a control circuit for controlling said first and second switching circuits to turn on said first and second switching circuits for a predetermined second interval which is included in a first interval for which said sense amplifier is activated in a stage of reading data from said memory cell, said second interval being shorter than said first interval, wherein a first level signal outputted from said PMOS transistor is outputted to said data output circuit via said first and second switching circuits when said PMOS transistor is turned on in said second interval, while the second level signal on said signal line pulled down by said pull-down resistor is outputted to said data output circuit via said second switching circuit when said PMOS transistor is turned off.

21. A data read circuit comprising:

an NMOS transistor having a drain connected to a read data bus and a grounded source, said NMOS transistor being disposed on each of a plurality of memory blocks of a semiconductor storage apparatus and being turned on and off in response to a read signal generated by a sense amplifier, wherein said read data bus is driven by said NMOS transistor and not by a PMOS transistor of a CMOS inverter.

22. The data read circuit as claimed in claim 21, further including a data output control circuit connected between said read data bus and a data output circuit for generating an output enable signal to control said sense amplifier.

23. A data read circuit comprising:

a PMOS transistor having a drain connected to a read data bus and a source connected to a power source, said PMOS transistor being disposed on each of a plurality of memory blocks of a semiconductor storage apparatus and being turned on and off in response to a read signal generated by a sense amplifier, wherein said read data bus is driven by said PMOS transistor and not by an NMOS transistor of a CMOS inverter.

24. The data read circuit as claimed in claim 23, further including a data output control circuit connected between said read data bus and a data output circuit for generating an output enable signal to control said sense amplifier.

25. A semiconductor storage apparatus of a CMOS memory comprising:

a memory array having a plurality of memory cells divided into a plurality of memory blocks, each of said memory blocks including a sense amplifier and an NMOS transistor having a drain connected to a read data bus and a grounded source, said NMOS transistor being turned on and off in response to a read signal generated by said sense amplifier, wherein said read data bus is driven by said NMOS transistor and not by a PMOS transistor of a CMOS inverter.

26. The semiconductor storage apparatus as claimed in claim 25, wherein the data read circuit includes a data output control circuit connected between said read data bus and a data output circuit for generating an output enable signal to control said sense amplifier.

27. A semiconductor storage apparatus of a CMOS memory comprising:

a memory array having a plurality of memory cells divided into a plurality of memory blocks, each of said memory blocks including a sense amplifier and an PMOS transistor having a drain connected to a read data bus and a source connected to a power source, said PMOS transistor being turned on and off in response to a read signal generated by said sense amplifier, wherein said read data bus is driven by said PMOS transistor and not by an NMOS transistor of a CMOS inverter.

28. The semiconductor storage apparatus as claimed in claim 27, wherein the data read circuit includes a data output control circuit connected between said read data bus and a data output circuit for generating an output enable signal to control said sense amplifier.

* * * * *